(12) United States Patent
Woo et al.

(10) Patent No.: US 12,158,673 B2
(45) Date of Patent: Dec. 3, 2024

(54) DISPLAY APPARATUS AND ELECTRONIC APPARATUS INCLUDING THE SAME

(71) Applicant: SAMSUNG DISPLAY CO., LTD., Yongin-si (KR)

(72) Inventors: Minwoo Woo, Yongin-si (KR); Sungho Kim, Yongin-si (KR); Jinsung An, Yongin-si (KR); Seunghyun Lee, Yongin-si (KR); Wangwoo Lee, Yongin-si (KR); Jiseon Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 120 days.

(21) Appl. No.: 17/836,492

(22) Filed: Jun. 9, 2022

(65) Prior Publication Data
US 2023/0152640 A1   May 18, 2023

(30) Foreign Application Priority Data

Nov. 12, 2021   (KR) .................. 10-2021-0156048

(51) Int. Cl.
*G02F 1/1362*   (2006.01)
*H10K 59/122*   (2023.01)
*H10K 59/126*   (2023.01)

(52) U.S. Cl.
CPC ..... *G02F 1/136209* (2013.01); *H10K 59/122* (2023.02); *H10K 59/126* (2023.02)

(58) Field of Classification Search
CPC .. H10K 59/122; H10K 59/126; H10K 59/121; H10K 59/131; H10K 59/30;
(Continued)

(56) References Cited

U.S. PATENT DOCUMENTS 8,710,527 B2   4/2014   Moon et al.
2016/0276419 A1*   9/2016   Lim .................. H10K 50/8426
(Continued)

FOREIGN PATENT DOCUMENTS

CN   112331703 A   2/2021
KR   101884737 B1   8/2018
(Continued)

*Primary Examiner* — Kevin Quarterman
(74) *Attorney, Agent, or Firm* — CANTOR COLBURN LLP

(57) ABSTRACT

An electronic apparatus includes: a housing having a backside and lateral sides; a cover window arranged on the housing; a display apparatus arranged under the cover window; a sensor unit arranged under the display apparatus; and a camera unit arranged under the display apparatus. The display apparatus includes: a substrate; a plurality of first electrodes arranged over the substrate; a plurality of emission layers on the plurality of first electrodes; a second electrode overlapping the plurality of first electrodes and the plurality of emission layers; and a shield pattern arranged between the substrate and the plurality of first electrodes, and overlapping the plurality of first electrodes in a plan view; The shield pattern includes a first part and a second part apart from the first part, and the second electrode includes an opening arranged between the first part and the second part in the plan view.

12 Claims, 24 Drawing Sheets

(58) Field of Classification Search
CPC .......................... H10K 50/841; H10K 59/65;
G02F 1/136209; G02F 1/13312; H04M
1/026; H04M 1/0264; H04M 2250/12;
H04M 1/0266
See application file for complete search history.

(56) References Cited

U.S. PATENT DOCUMENTS

| | | | |
|---|---|---|---|
| 2019/0384121 A1* | 12/2019 | Nishiwaki | G02F 1/133528 |
| 2020/0303478 A1* | 9/2020 | Lee | H10K 59/124 |
| 2021/0202900 A1 | 7/2021 | Lee | |
| 2021/0359025 A1* | 11/2021 | Jung | H10K 71/00 |
| 2022/0052140 A1* | 2/2022 | Choi | H10K 59/126 |

FOREIGN PATENT DOCUMENTS

| KR | 20200134908 A | 12/2020 |
|---|---|---|
| KR | 1020210086888 A | 7/2021 |

\* cited by examiner

DISPLAY APPARATUS AND ELECTRONIC APPARATUS INCLUDING THE SAME

BACKGROUND

This application claims priority to Korean Patent Application No. 10-2021-0156048, filed on Nov. 12, 2021, and all the benefits accruing therefrom under 35 U.S.C. § 119, the content of which in its entirety is herein incorporated by reference.

1. Field

One or more embodiments relate to a display apparatus and an electronic apparatus including the same.

2. Description of the Related Art

The usage of a display apparatus has diversified. In addition, as the display apparatus has become thinner and lighter, its range of use has gradually been extended.

As the area occupied by an area that displays images in the display apparatus expands, various functions that are combined or associated with the display apparatus have been added. As alternatives for adding various functions, research has been carried out on the display apparatus having a region for various functions while displaying images.

The region for various functions while displaying images is desirable to maintain a high transmittance for light, sound or the like to perform the function thereof.

SUMMARY

One or more embodiments include a display apparatus having a region in which various components may be arranged inside a display area, and with an improved transmittance for the relevant region. However, such a technical problem is an example, and the disclosure is not limited thereto.

Additional aspects will be set forth in part in the description which follows and, in part, will be apparent from the description, or may be learned by practice of the presented embodiments of the disclosure.

According to one or more embodiments, an electronic apparatus includes: a housing having a backside and lateral sides; a cover window arranged on the housing; a display apparatus arranged under the cover window; a sensor unit arranged under the display apparatus; and a camera unit arranged under the display apparatus, where the display apparatus includes: a substrate; a plurality of first electrodes arranged over the substrate; a plurality of emission layers on the plurality of first electrodes; a second electrode overlapping the plurality of first electrodes and the plurality of emission layers; and a shield pattern arranged between the substrate and the plurality of first electrodes, and overlapping the plurality of first electrodes in a plan view, where the shield pattern includes a first part and a second part apart from the first part, and where the second electrode defines an opening arranged between the first part and the second part in a plan view.

The shield pattern may include a plurality of parts each having a wave shape in the plan view.

The shield pattern may have a spiral shape in a plan view.

The shield pattern may include at least a portion of a pattern including a plurality of circles of different sizes and straight sections, and the straight sections may be arranged to connect the plurality of circles and disposed between the plurality of circles in the plan view.

A width of the shield pattern may be about 1 micrometers (μm) to about 10 μm.

The shield pattern may include at least one of molybdenum (Mo), titanium (Ti), aluminum (Al), and silver (Ag).

The electronic apparatus may further include a subsidiary shield pattern arranged in the same layer as the plurality of first electrodes.

According to one or more embodiments, a display apparatus including a main display area, a component area, and a non-display area includes: a substrate; a plurality of first display elements arranged in the main display area; a plurality of second display elements arranged in the component area, where the component area is at least partially surrounded by the main display area; and a shield pattern overlapping the plurality of second display elements in the component area in a plan view.

The shield pattern may be arranged between the substrate and the plurality of second display elements.

Each of the plurality of first display elements and the plurality of second display elements may include: a first electrode; an emission layer overlapping the first electrode; and a portion of a second electrode that is a common part of the plurality of first display elements and the plurality of second display elements, where the shield pattern may overlap the first electrodes of the plurality of second display elements in the plan view.

The shield pattern may include a first part and a second part apart from the first part, where the second electrode may define an opening arranged between the first part and the second part of the shield pattern in the plan view.

The display apparatus may further include a plurality of first sub-pixel circuits electrically connected to the plurality of first display elements and arranged in the main display area, where each of the plurality of first sub-pixel circuits may include a semiconductor layer, a gate electrode that overlaps a channel region of the semiconductor layer, and an electrode electrically connected to a source region or a drain region of the semiconductor layer.

The shield pattern may be arranged in the same layer as the electrode of each of the plurality of first sub-pixel circuits or the gate electrode.

The shield pattern may be arranged between the substrate and the semiconductor layer.

The shield pattern may contact a lower portion of the first electrode.

The shield pattern may include a plurality of parts each having a wave shape in the plan view.

The shield pattern may have a spiral shape in the plan view.

The shield pattern may include at least a portion of a pattern including a plurality of circles of different sizes and straight sections, and the straight sections may be arranged to connect the plurality of circles and disposed between the plurality of circles in the plan view.

A width of the shield pattern may be about 1 μm to about 10 μm.

The display apparatus may further include a plurality of second sub-pixel circuits electrically connected to the plurality of second display elements, where the plurality of second sub-pixel circuits may be arranged in the non-display area or between the main display area and the component area.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
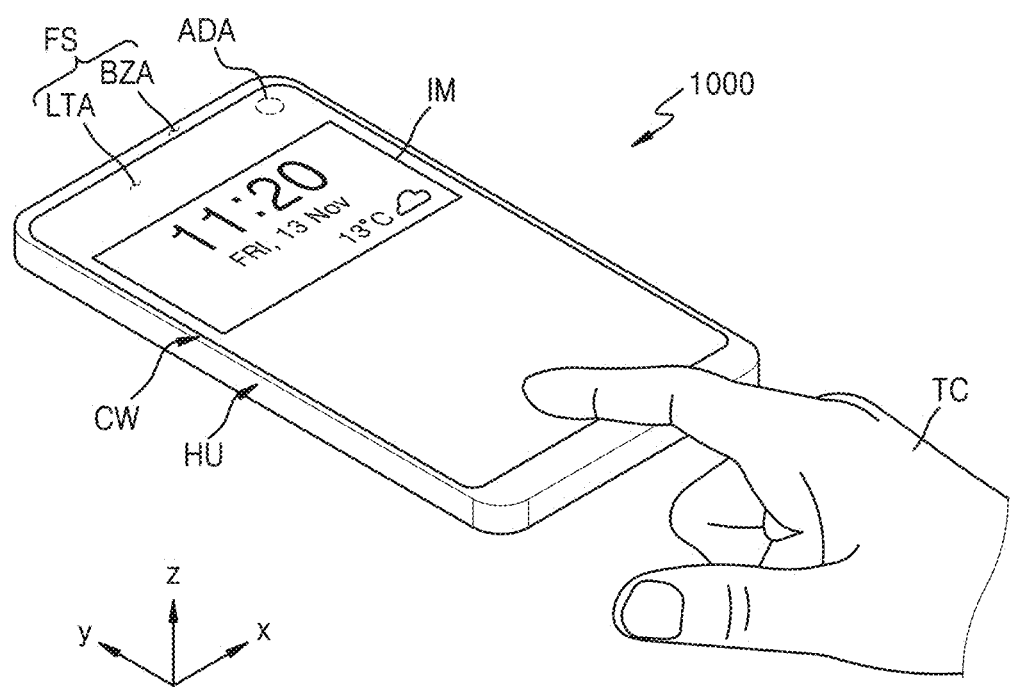
FIG. 1 is a schematic perspective view of an electronic apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, wherein like reference numerals refer to like elements throughout and a repeated description thereof is omitted.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

In the present specification, "A and/or B" means A or B, or A and B. In the present specification, "at least one of A and B" means A or B, or A and B.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

In the case where a certain embodiment may be implemented differently, a specific process order may be performed in the order different from the described order. As an example, two processes that are successively described may be substantially simultaneously performed or performed in the order opposite to the order described.

Sizes of elements in the drawings may be exaggerated or reduced for convenience of explanation. For example, since sizes and thicknesses of elements in the drawings are arbitrarily illustrated for convenience of explanation, the disclosure is not limited thereto.

Figure 2A:
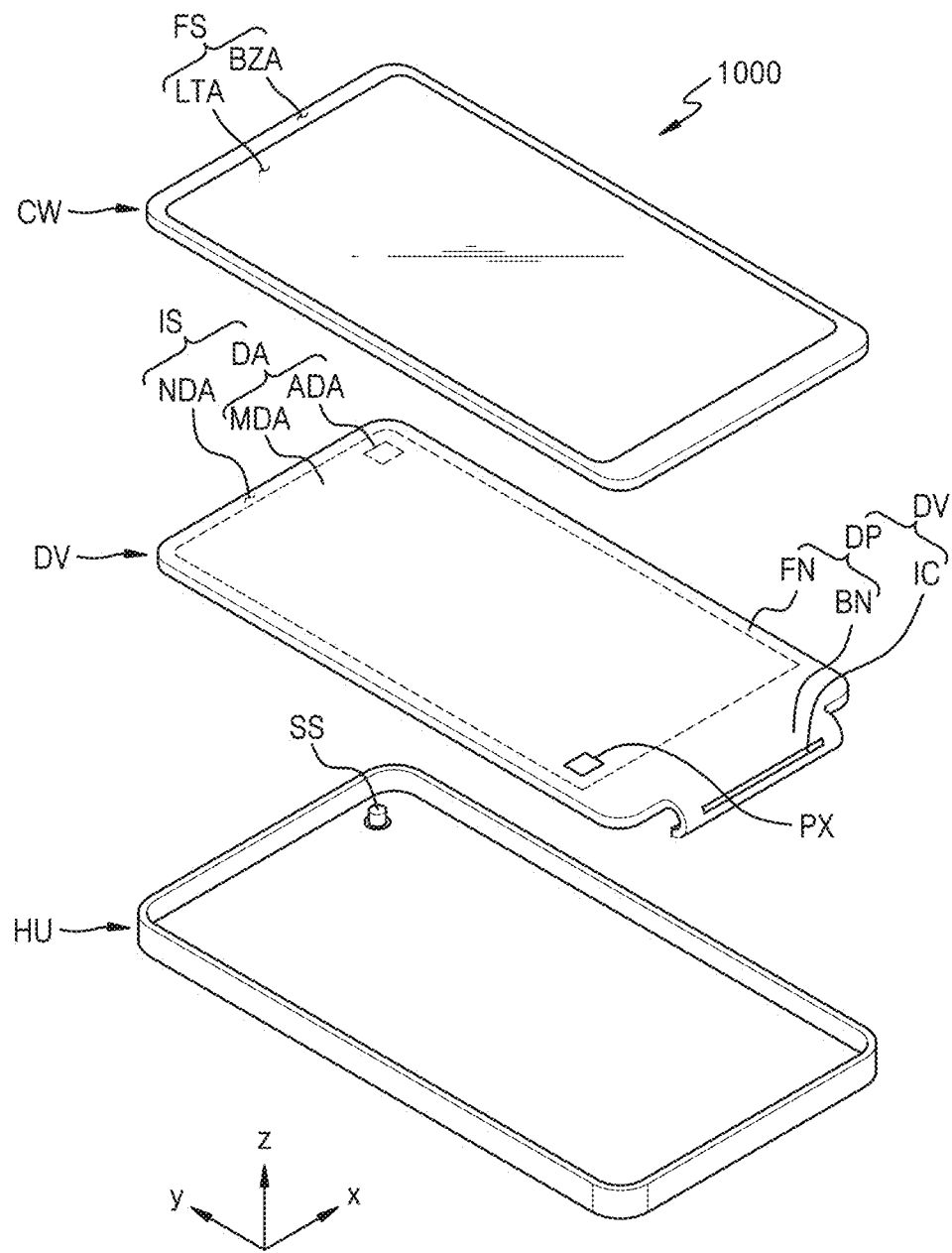
FIG. 2A is an exploded perspective view of an electronic apparatus according to an embodiment.
Figure 2B:
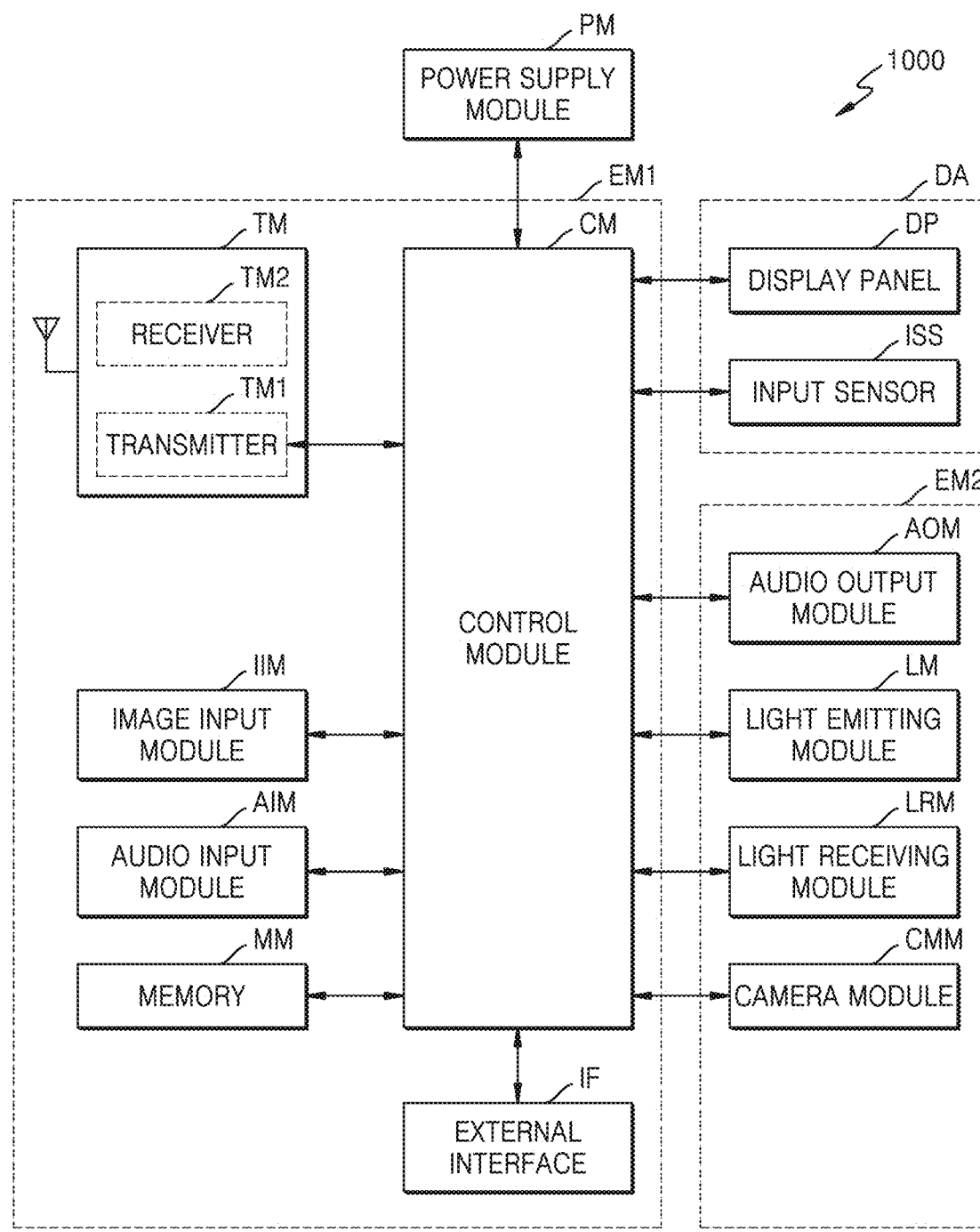
FIG. 2B is a block diagram of an electronic apparatus according to an embodiment.

FIG. 1 is a schematic perspective view of an electronic apparatus 1000 according to an embodiment, FIG. 2A is an exploded perspective view of the electronic apparatus 1000 according to an embodiment, and FIG. 2B is a block diagram of the electronic apparatus 1000 according to an embodiment.

In an embodiment, the electronic apparatus 1000 is an apparatus that displays moving images or still images, and may be used as a display screen of various products including televisions, notebook computers, monitors, advertisement boards, Internet of things ("IoT") as well as portable electronic apparatuses including mobile phones, smart phones, tablet personal computers ("PC"), mobile communication terminals, electronic organizers, electronic books, portable multimedia players ("PMP"), navigations, and ultra mobile personal computers ("UMPC"). In addition, in an embodiment, the electronic apparatus 1000 may be used in wearable devices including smartwatches, watchphones, glasses-type displays, and head-mounted displays ("HMD"). In addition, in an embodiment, the electronic apparatus 1000 may be used as instrument panels for automobiles, center fascias for automobiles, or center information displays ("CID") arranged on a dashboard, room mirror displays that replace side mirrors of automobiles, and displays arranged on the backside of front seats as an entertainment for back seats of automobiles. For convenience of description, FIG. 1 shows the electronic apparatus 1000 is used as a smartphone.

Referring to FIGS. 1, 2A, and 2B, the electronic apparatus 1000 may display an image IM in a z direction on a display surface IS parallel to an x direction and a y direction. The display surface IS on which an image IM is displayed may correspond to a front surface of the electronic apparatus 1000 and correspond to a front surface FS of a cover window CW.

Hereinafter, the same reference numeral is used for a display surface and a front surface of the electronic apparatus 1000, and the front surface of the cover window CW. An image IM may include not only moving images but still images. FIG. 1 shows a clock as an example of an image IM.

In the present embodiment, a front surface (or an upper surface) and a backside (or a lower surface) of members are defined based on the direction in which an image IM is displayed. The front surface is opposite to the backside in the z direction, and a normal direction of each of the front surface and the backside may be parallel to the z direction.

The electronic apparatus 1000 may sense a user's input TC applied from outside. The user's input TC may include various types of external inputs such as a portion of a user's body, light, heat, pressure or the like. In an embodiment, the user's input TC is shown as a user's hand applied to the front surface. However, an embodiment according to the invention are not limited thereto. The user's input TC may be provided in various forms. In addition, the electronic apparatus 1000 may sense a user's input TC applied to the lateral surface or the backside of the electronic apparatus 1000 depending on the structure of the electronic apparatus 1000.

The electronic apparatus 1000 may include the cover window CW, a housing HU, a display apparatus DV, and an electronic module SS. In an embodiment, the cover window CW may be combined with the housing HU to constitute the appearance of the electronic apparatus 1000.

Referring to FIGS. 1 and 2A, the front surface FS of the cover window CW may define the front surface of the electronic apparatus 1000. A light transmissive area LTA may be an optically transparent region. As an example, the light transmissive area LTA may be a region having visible light transmittance of 90% or more.

A bezel area BZA may define the shape of the light transmissive area LTA. The bezel area BZA may be adjacent to the light transmissive area LTA and may surround the light transmissive area LTA. The bezel area BZA may be a region having a relatively low light transmittance compared to the light transmissive area LTA. The bezel area BZA may include an opaque material that blocks light. The bezel area BZA may have a preset color. The bezel area BZA may be defined by a bezel layer provided separately from a transparent substrate that defines the light transmissive area LTA, or defined by an ink layer inserted into or colored on the transparent substrate.

The housing HU may be combined with the cover window CW. The housing HU may include the backside and the lateral surfaces. The cover window CW may be arranged on the front surface FS of the housing HU. That is, the cover window CW may be arranged on the housing HU. The housing HU may be combined with the cover window CW to provide a preset receiving space. The display apparatus DV and the electronic module SS may be received in the preset receiving space provided between the housing HU and the cover window CW.

The housing HU may include a material having a relatively high strength. As an example, the housing HU may include glass, plastic, or metal, or include a plurality of frames and/or plates including a combination thereof. The housing HU may stably protect elements of the electronic apparatus 1000 received in the inner space of the housing HU from external impacts.

The display apparatus DV may include a display panel DP that displays an image IM, an input sensor ISS (see FIG. 2B) that senses an external input TC, and a driving circuit IC. The display apparatus DV may include the front surface IS including a display area DA and a non-display area NDA. The display area DA may be an active area activated according to an electric signal.

In an embodiment, the display area DA may be a region in which an image IM is displayed and, simultaneously, an external input TC is sensed. The display area DA may be a region in which a plurality of sub-pixels PX described below are arranged.

The display area DA may overlap at least a portion of the light transmissive area LTA of the cover window CW in a plan view. As an example, a portion or all of the display area DA may overlap the light transmissive area LTA. Accordingly, a user may view an image IM or provide an external input TC through the light transmissive area LTA. However, an embodiment according to the invention are not limited thereto. As an example, a region in which an image IM is displayed may be separated from a region in which an external input TC is sensed inside the display area DA.

The non-display area NDA may overlap at least a portion of the bezel area BZA of the cover window CW in a plan view. The non-display area NDA may be a region covered by the bezel area BZA. The non-display area NDA may be adjacent to the display area DA. The non-display area NDA may surround the display area DA. The non-display area NDA may be a region in which an image IM is not displayed. A driving circuit for driving the display area DA, a driving wiring or the like may be arranged in the non-display area NDA.

The display apparatus DV may be assembled in a flat state in which the display area DA and the non-display area NDA face the cover window CW. However, an embodiment according to the invention are not limited thereto. In an embodiment, a portion of the non-display area NDA of the display apparatus DV may be bent. In this case, a portion of the non-display area NDA may face the backside of the electronic apparatus 1000, and thus, the bezel area BZA viewed from the electronic apparatus 1000 may be reduced. Alternatively, the display apparatus DV may be assembled with a portion of the display area DA bent. Alternatively, the non-display area NDA in the display apparatus DV may be omitted.

The display area DA may include an auxiliary display area ADA and a main display area MDA. The auxiliary display area ADA may have a relatively high light transmittance compared to the main display area MDA. In addition, the auxiliary display area ADA may have a relatively small area compared to the main display area MDA. The auxiliary display area ADA may be defined as a region in which the electronic module SS is arranged inside the housing HU in the display apparatus DV. In an embodiment, though the auxiliary display area ADA is shown as a quadrangular shape (e.g., FIG. 4A), embodiments according to the invention are not limited thereto. The auxiliary display area ADA may have various shapes such as polygons, ellipses, shapes with at least one curve or the like.

The main display area MDA may be adjacent to the auxiliary display area ADA. In an embodiment, the main display area MDA may surround the auxiliary display area ADA entirely. However, an embodiment according to the invention are not limited thereto. The main display area MDA may partially surround the auxiliary display area ADA.

The auxiliary display area ADA may be defined inside the light transmissive area LTA. The auxiliary display area ADA may be a region that at least partially overlaps the electronic module SS in a plan view. Though it is shown in FIG. 1 that the auxiliary display area ADA is provided in a quadrangular shape on the upper right end of the electronic apparatus 1000, an embodiment according to the invention are not limited thereto. The auxiliary display area ADA may be provided in various numbers and shapes according to the number and shape of the electronic modules SS.

The electronic apparatus 1000 may receive external signals required for the electronic module SS through the auxiliary display area ADA, or provide signals output from the electronic module SS to outside.

Referring to FIG. 2B, the display apparatus DV may include the display panel DP and the input sensor ISS. The display panel DP may be an element that generates an image IM. An image IM generated by the display panel DP may be displayed on the display surface IS through the light transmissive area LTA and viewed by a user in outside.

The input sensor ISS may sense an external input TC applied from outside. The input sensor ISS may sense an external input TC provided to the cover window CW.

Referring to FIG. 2A again, the display panel DP may include a flat portion FN and a bent portion BN. The flat portion FN may be assembled in a state substantially parallel to a plane defined by the x direction and the y direction. The display area DA may be provided to the flat portion FN.

The bent portion BN may extend from the flat portion FN, and at least a portion of the bent portion BN may be bent. The bent portion BN may be bent from the flat portion FN and assembled to be arranged on the backside of the flat portion FN. Because the bent portion BN overlaps the flat portion FN in a plan view when assembled, the bezel area BZA of the electronic apparatus 1000 may be reduced. However, an embodiment according to the invention are not limited thereto. As an example, the bent portion BN may be omitted.

The driving circuit IC may be mounted on the bent portion BN. The driving circuit IC may be provided in a chip form. However, an embodiment according to the invention are not limited thereto. The driving circuit IC may be provided to a separate circuit substrate and electrically connected to an electronic panel EP through a flexible film or the like.

The driving circuit IC may be electrically connected to the display area DA to transfer electric signals to the display area DA. As an example, the driving circuit IC may include a data driving circuit and provide data signals to sub-pixels PX arranged in the display area DA. Alternatively, the driving circuit IC may include a touch driving circuit and be electrically connected to the input sensor ISS arranged in the display area DA. The driving circuit IC may include various circuits besides the above circuits and be designed to provide various electric signals to the display area DA.

The electronic apparatus 1000 may further include a main circuit board electrically connected to the display panel DP and the driving circuit IC. The main circuit board may include various kinds of driving circuits for driving the electronic panel EP, a connector for supplying power or the like. The main circuit board may be a rigid printed circuit board ("PCB"), or a flexible circuit board.

The electronic module SS may be arranged under the display apparatus DV. The electronic module SS may receive external signals transferred through the auxiliary display area ADA, or output signals through the auxiliary display area ADA. In an embodiment, because the auxiliary display area ADA having a relatively high transmittance is arranged inside the display area DA, the electronic module SS may be arranged to overlap the display area DA in a plan view, and thus, the area (or the size) of the bezel area BZA may be reduced.

Referring to FIG. 2B, the electronic apparatus 1000 may include the display apparatus DV, a power supply module PM, a first electronic module EM1, and a second electronic module EM2. The display apparatus DV, the power supply module PM, the first electronic module EM1, and the second electronic module EM2 may be electrically connected to each other. FIG. 2B shows the display panel DP and the input sensor ISS among the elements of the display apparatus DV.

The power supply module PM may supply power required for an overall operation of the electronic apparatus 1000. The power supply module PM may include a general battery module.

The first electronic module EM1 and the second electronic module EM2 may include various functional modules for operating the electronic apparatus 1000. The first electronic module EM1 may be directly mounted on a motherboard electrically connected to the display panel DP, or mounted on a separate board and electrically connected to the motherboard through a connector (not shown).

The first electronic module EM1 may include a control module CM, a wireless communication module TM, an image input module IIM, an acoustic input module AIM, a memory MM, and an external interface IF. Some of modules may not be mounted on the motherboard and may be electrically connected to the motherboard through a flexible circuit board.

The control module CM may be configured to control an overall operation of the electronic apparatus 1000. The control module CM may be a microprocessor. As an example, the control module CM may activate or inactivate the display panel DP. The control module CM may be configured to control other modules such as the image input module IIM, the acoustic input module AIM or the like based on touch signals received from the display panel DP.

The wireless communication module TM may transmit/receive wireless signals to/from another terminal by using a Bluetooth or wireless-fidelity ("Wi-Fi") line. The wireless communication module TM may transmit/receive voice signals by using a general communication line. The wireless communication module TM includes a transmitter TM1 and a receiver TM2, the transmitter TM1 modulating and transmitting signals, and the receiver TM2 demodulating received signals.

The image input module IIM may process image signals and convert the image signals to image data that is displayable in the display apparatus DV. The acoustic input module AIM may receive external acoustic signals by using a microphone in a recording mode, a voice recognition mode or the like, and convert the external acoustic signals to electric voice data.

The external interface IF may serve as an interface connected to an external charger, a wired/wireless data port, a card socket (e.g., a memory card), a subscriber identification module/user identification module ("SIM/UIM") card, or the like.

The second electronic module EM2 may include an acoustic output module AOM, a light-emitting module LM, a light-receiving module LRM, a camera module CMM, or the like. The second electronic module EM2 may be directly mounted on the motherboard, or mounted on a separate board and electrically connected to the display apparatus DV or the first electronic module EM1 through a connector (not shown).

The acoustic output module AOM may convert acoustic data received from the wireless communication module TM or acoustic data stored in the memory MM and output the same.

The light-emitting module LM may generate and output light. The light-emitting module LM may output an infrared ray. As an example, the light-emitting module LM may include a light-emitting diode ("LED"). As an example, the light-receiving module LRM may sense an infrared ray. The light-receiving module LRM may be activated when an infrared ray of a preset level or more is sensed. The light-receiving module LRM may include a complementary metal-oxide semiconductor ("CMOS") sensor. Infrared light generated by the light-emitting module LM is output and then reflected by an external object (e.g., a user's finger or face), and the reflected infrared light may be incident to the light-receiving module LRM. The camera module CMM may be configured to photograph an external image.

In an embodiment, the electronic module SS may include at least one of the first electronic module EM1 and the second electronic module EM2. As an example, the electronic module SS may include at least one of a camera, a speaker, a light-sensing sensor, and a heat-sensing sensor. The electronic module SS may sense an external object received through the front surface IS, or provide sound signals such as voices or the like to the outside through the front surface IS. In addition, the electronic module SS may include a plurality of elements and is not limited to one embodiment.

Figure 3A:
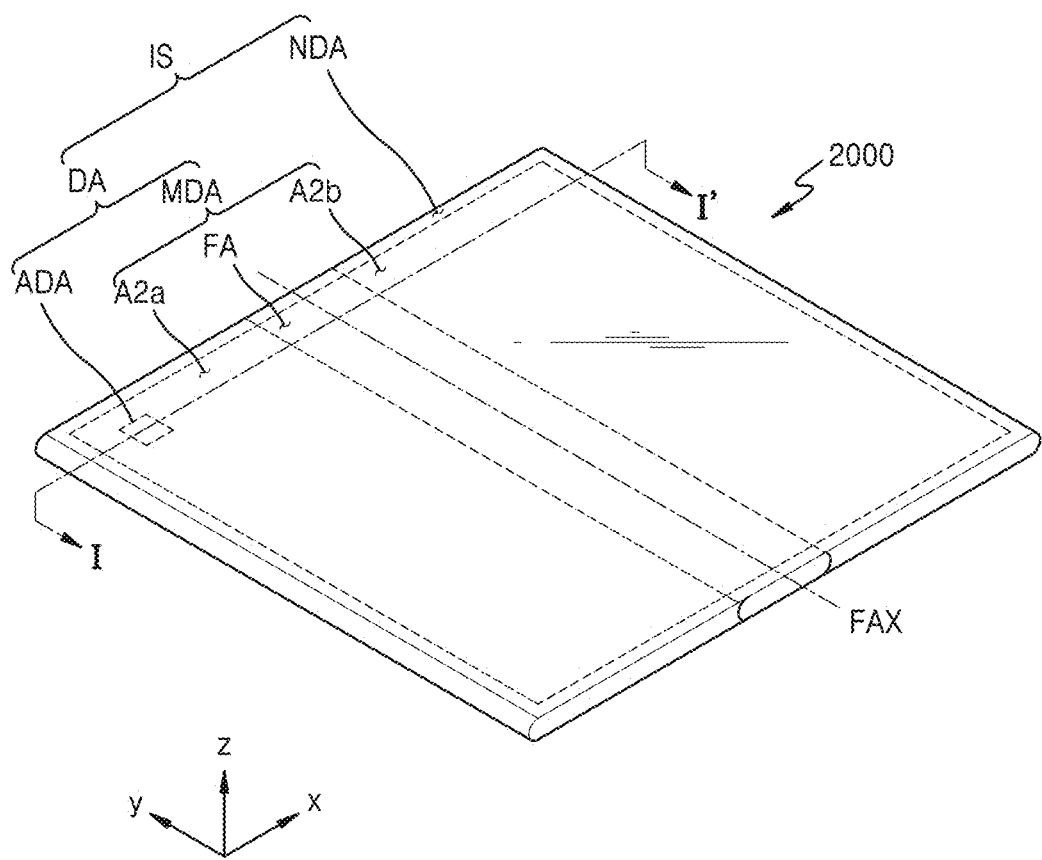
FIG. 3A is a schematic perspective view of an electronic apparatus according to an embodiment.
Figure 3B:
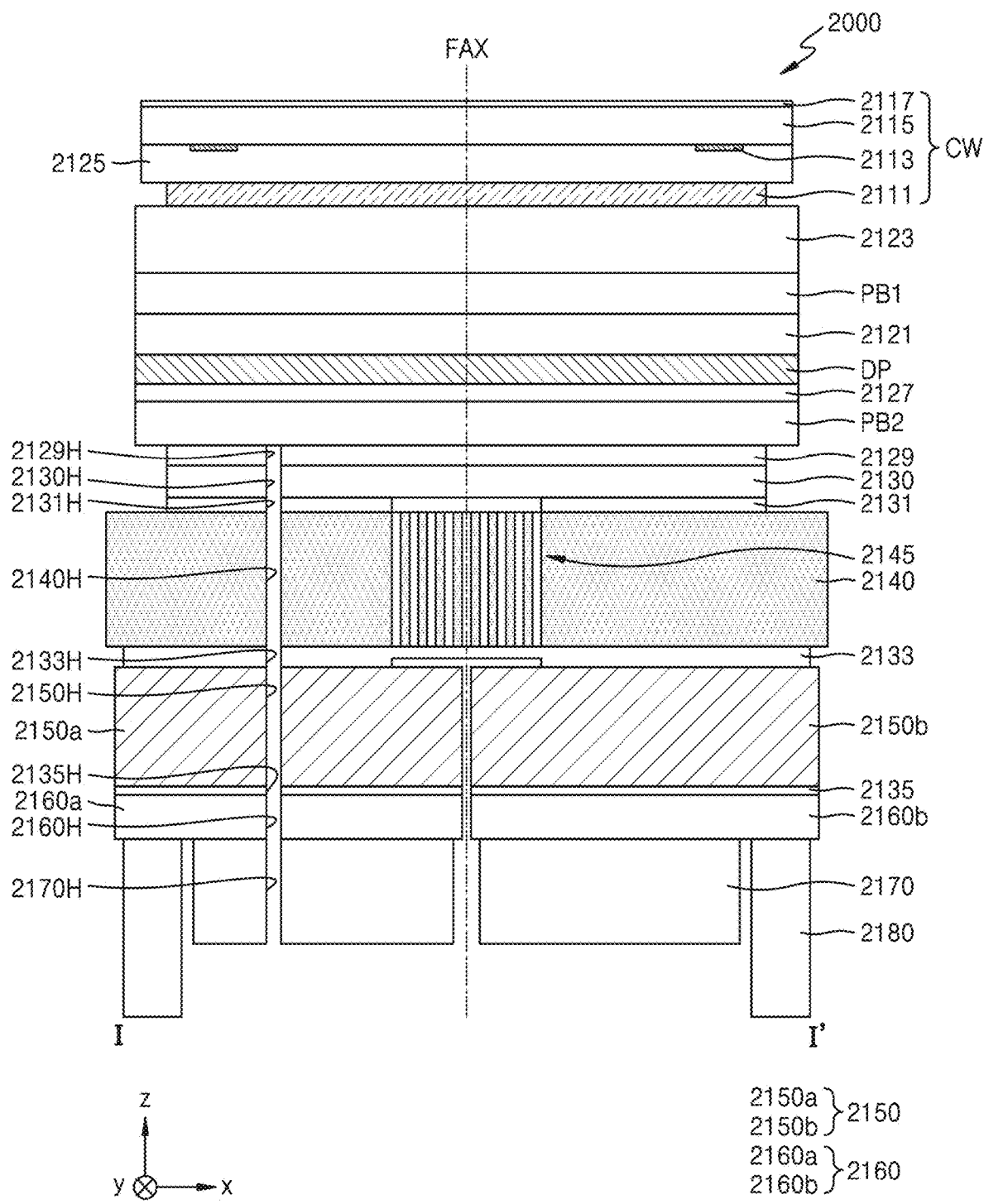
FIG. 3B is a schematic cross-sectional view of an electronic apparatus according to an embodiment.

FIG. 3A is a schematic perspective view of an electronic apparatus 2000 according to an embodiment, and FIG. 3B is a schematic cross-sectional view of the electronic apparatus 2000 according to an embodiment. FIG. 3A is a view of the electronic apparatus 2000 provided as a foldable electronic apparatus 2000, and FIG. 3B is a view for explaining stacking relationship of members constituting the electronic apparatus 2000. FIG. 3B schematically shows the members constituting the electronic apparatus 2000.

Referring to FIG. 3A, in an embodiment, the electronic apparatus 2000 may be the foldable electronic apparatus 2000. The electronic apparatus 2000 may be folded based on (or around) a folding axis FAX. As an example, the electronic apparatus 2000 may be folded around (or based on) the folding axis FAX. In an embodiment, the display surface IS of the electronic apparatus 2000 may be arranged on the outer side or the inner side of the electronic apparatus 2000.

The electronic apparatus 2000 may include a housing, a display apparatus, and a cover window.

In an embodiment, the display apparatus may include the display area DA and the non-display area NDA. The display area DA may be a region in which images are displayed, and simultaneously, be a region in which an external image is sensed. The display area DA may be a region in which a plurality of pixels described below are arranged.

The display area DA may include the auxiliary display area ADA and the main display area MDA. In addition, the main display area MDA may include a (2-1)st area A2a, a (2-2)nd area A2b, and a folded area FA. The (2-1)st area A2a and the (2-2)nd area A2b may be arranged on the left side and the right side, respectively, with respect to (or around) the folding axis FAX. The folded area FA may be arranged between the (2-1)st area A2a and the (2-2)nd area A2b. However, an embodiment according to the invention are not limited thereto.

Though it is shown in FIG. 3A that the auxiliary display area ADA is provided in a quadrangular shape on the upper left end of the electronic apparatus 2000, an embodiment according to the invention are not limited thereto. The auxiliary display area ADA may be provided in various numbers and shapes according to the number and shape of the electronic modules SS (see FIG. 2A).

In addition, though it is shown in FIG. 3A that the auxiliary display area ADA is adjacent to the (2-1)st area A2a, an embodiment according to the invention are not limited thereto. In an embodiment, the auxiliary display area ADA may be adjacent to the (2-2)nd area A2b.

Referring to FIG. 3B, in an embodiment, the electronic apparatus 2000 may include the cover window CW, a first protective member PB1, the display apparatus DV, a second protective member PB2, a first support member 2130, a second support member 2140, a digitizer 2150, a plate 2160, a cushion layer 2170, and a water-proof member 2180.

The first protective member PB1 may be arranged over the display apparatus DV. The first protective member PB1 may be attached to the upper surface of the display apparatus DV through a first adhesive layer 2121. In this case, the first adhesive layer 2121 may be a pressure sensitive adhesive ("PSA"). However, an embodiment according to the invention are not limited thereto. The first adhesive layer 2121 may be provided as an optically clear adhesive ("OCA").

The first protective member PB1 may be arranged over the display apparatus DV to protect the display apparatus DV from external impacts. The first protective member PB1 may include a polymer resin. As an example, the first protective member PB1 may include a polymer resin such as polyethersulfone, polyacrylate, polyetherimide, polyethylene naphthalate, polyethylene terephthalate, polyphenylene sulfide, polyarylate, polyimide, polycarbonate, cellulose acetate propionate, or the like. However, an embodiment according to the invention are not limited thereto. The first protective member PB1 may include glass, quartz or the like.

The cover window CW may be arranged over the first protective member PB1. The cover window CW may be attached to the upper surface of the first protective member PB1 by the second adhesive layer 2123.

The cover window CW may include a window 2111, an opaque layer 2113, a window protective member 2115, and a hard coating layer 2117. The window 2111 may include an ultra-thin glass ("UTG™"). However, an embodiment according to the invention are not limited thereto. The window 2111 may include a polymer resin.

The window protective member 2115 may be arranged over the window 2111. The window protective member 2115 may be attached to the upper surface of the window 2111 by a third adhesive layer 2125. The window protective member 2115 may protect the window 2111 from external impacts and prevent or reduce scratches from occurring in the upper surface of the window 2111. The window protective member 2115 may include a polymer resin. However, an embodiment according to the invention are not limited thereto. The window protective member 2115 may include an inorganic material.

The opaque layer 2113 may be arranged between the window protective member 2115 and the third adhesive layer 2125. However, an embodiment according to the invention are not limited thereto. The opaque layer 2113 may be provided in a portion of the window protective member 2115. The opaque layer 2113 may include an opaque material such that wirings, circuits or the like of the display apparatus DV are not identified from the outside. A portion in which the opaque layer 2113 is arranged may be the bezel area BZA.

The hard coating layer 2117 may be arranged on the window protective member 2115. The hard coating layer 2117 may include an organic material such as a polymer resin or the like. However, an embodiment according to the invention are not limited thereto. The hard coating layer 2117 may include an inorganic material.

The hard coating layer 2117 may be an outermost layer of the cover window CW. In this case, the outermost layer of the cover window CW may denote the outermost layer of the electronic apparatus 2000. The outermost layer of the cover window CW is a layer directly touched by a user. In the case where the outermost layer of the cover window CW is an ultra thin glass (UTG™) or the window protective member 2115, a user's touch sensation may be reduced. Because the outermost layer of the cover window CW includes the hard coating layer 2117, a smooth and soft touch sensation may be provided to a user.

The second protective member PB2 may be arranged below the display apparatus DV. The second protective member PB2 may be attached to the lower surface of the display apparatus DV by a fourth adhesive layer 2127. The second protective member PB2 may be arranged below the display apparatus DV to support the display apparatus DV and protect the display apparatus DV from external impacts. The second protective member PB2 may include a polymer resin such as polyethylene terephthalate or polyimide.

The first support member 2130 may be arranged below the second protective member PB2. The first support member 2130 may be attached to the second protective member PB2 by a fifth adhesive layer 2129. The first support member 2130 may be arranged below the display apparatus DV to support the display apparatus DV. The first support member 2130 may include a polymer resin such as polyethylene terephthalate or polyimide.

The second support member 2140 may be arranged below the first support member 2130. The second support member 2140 may be attached to the first support member 2130 by a sixth adhesive layer 2131. In an embodiment, the sixth adhesive layer 2131 may not be provided to a portion corresponding to the folded area FA.

The second support member 2140 may be arranged below the display apparatus DV to support the display apparatus DV. In addition, the second support member 2140 may be arranged over the digitizer 2150 described below to protect the digitizer 2150 from external impacts.

In an embodiment, the second support member 2140 may include a folding structure 2145. The folding structure 2145 may change its shape or its length when the electronic apparatus 2000 is folded. As an example, the folding structure 2145 may include a pattern part including openings, include an uneven shape, or include a link rotatably linked or the like. However, an embodiment according to the invention are not limited thereto.

In an embodiment, while folded, the electronic apparatus 2000 may be folded based on (or around) the folding axis FAX. In an embodiment, the folding structure 2145 may be provided such that both sides thereof are symmetric with respect to (or around) the folding axis FAX. In an embodiment, the second support member 2140 except the folding structure 2145 may have a flat upper shape.

In an embodiment, the second support member 2140 may include at least one of glass, plastic, and metal. In an embodiment, the second support member 2140 may include polyurethane or include carbon fiber reinforced plastic ("CFRP"). In an embodiment, the folding structure 2145 may include the same material as the material of the second support member 2140 or include a material different from the material of the second support member 2140.

The digitizer 2150 may be arranged below the second support member 2140. The digitizer 2150 may be attached to the second support member 2140 by a seventh adhesive layer 2133. The seventh adhesive layer 2133 may be arranged under the second support member 2140 to prevent or reduce foreign materials from being introduced into the folding structure 2145.

The digitizer 2150 may include a body layer and/or a pattern layer. The digitizer 2150 may sense signals input from an external electronic pen or the like through the pattern layer. Particularly, the digitizer 2150 may sense the intensity, direction or the like of signals input from the electronic pen or the like.

In the case where the digitizer 2150 is provided as one body, cracks may occur to the body layer and/or the pattern layer of the digitizer 2150 while the electronic apparatus 2000 is folded. In an embodiment, the digitizer 2150 may include a first digitizer 2150a and a second digitizer 2150b, the first digitizer 2150a being on the left around the folding axis FAX, and the second digitizer 2150b being on the right around the folding axis FAX. The first digitizer 2150a may overlap at least a portion of the (2-1)st area A2a of FIG. 3A, and the second digitizer 2150b may overlap at least a portion of the (2-2)nd area A2b. In addition, the first digitizer 2150a may overlap at least a portion of the folded area FA (see FIG. 3A), and the second digitizer may overlap at least a portion of the folded area FA in a plan view (see FIG. 3A).

In an embodiment, the first digitizer 2150a may be apart from the second digitizer 2150b in the x direction with the folding axis FAX therebetween. That is, the digitizer 2150 may be provided in a separated structure instead of an integral structure. Because the digitizer 2150 is provided in a separated structure, cracks may be prevented or reduced from occurring to the body layer and/or the pattern layer arranged in the folded area FA.

In addition, because the digitizer 2150 is provided in the separated structure and the digitizer 2150 provided in the separated structure is provided to overlap at least a portion of the folded area FA (see FIG. 3A) in a plan view, the digitizer 2150 may receive signals from even the folded area FA, and thus, user convenience may be improved.

The plate 2160 may be arranged below the digitizer 2150. The plate 2160 may be attached to the lower surface of the digitizer 2150 by an eighth adhesive layer 2135. In an embodiment, the eighth adhesive layer 2135 may not be provided to a portion corresponding to the folded area FA.

The plate 2160 may be configured to transfer heat occurring from the digitizer 2150 to the outside. In this case, the plate 2160 may include metal having a high heat transfer efficiency. Alternatively, the plate 2160 may include graphite having a high heat conductivity in a plane direction. In the case where the plate 2160 includes graphite, the plate 2160 may have a thinner thickness than the case where the plate 2160 includes metal. In addition, the plate 2160 may be arranged below the digitizer 2150 to support the digitizer 2150 and protect the digitizer 2150 from external impacts.

The plate 2160 may include a first plate 2160a and a second plate 2160b, the first plate 2160a being on the left around the folding axis FAX, and the second plate 2160b being on the right around the folding axis FAX.

The cushion layer 2170 may be arranged under the plate 2160. The cushion layer 2170 may prevent or reduce the digitizer 2150 arranged on the cushion layer 2170 from being damaged due to external impacts. In an embodiment, the cushion layer 2170 may include a pressure sensitive adhesive.

The water-proof member 2180 may be arranged outside the cushion layer 2170. The water-proof member 2180 may prevent or reduce the elements of the electronic apparatus 2000 from being damaged by moisture by blocking or absorbing moisture introduced from the outside of the electronic apparatus 2000. In this case, the water-proof member 2180 may include a tape, a sponge or the like.

In an embodiment, through-holes 2129H, 2130H, 2131H, 2140H, 2133H, 2150H, 2135H, 2160H, and 2170H each corresponding to the auxiliary display area ADA may be provided in the fifth adhesive layer 2129, the first support member 2130, the sixth adhesive layer 2131, the second support member 2140, the seventh adhesive layer 2133, the digitizer 2150, the eighth adhesive layer 2135, the plate 2160, and the cushion layer 2170, respectively. However, embodiments according to the invention are not limited thereto. A through-hole may not be provided in at least one of the fifth adhesive layer 2129, the first support member 2130, the sixth adhesive layer 2131, the second support member 2140, the seventh adhesive layer 2133, the digitizer 2150, the eighth adhesive layer 2135, the plate 2160, and the cushion layer 2170 in another embodiment. In addition, though not shown, a through-hole may be additionally provided in the second protective member PB2.

In addition, though it is shown in FIG. 3B that the through-holes 2129H, 2130H, 2131H, 2140H, 2133H, 2150H, 2135H, 2160H, and 2170H corresponding to the auxiliary display area ADA are provided in the left of the electronic apparatus 2000, an embodiment according to the invention is not limited thereto. In an embodiment, the through-holes 2129H, 2130H, 2131H, 2140H, 2133H, 2150H, 2135H, 2160H, and 2170H corresponding to the auxiliary display area ADA are provided in the right of the electronic apparatus 2000.

Because the through-holes 2129H, 2130H, 2131H, 2140H, 2133H, 2150H, 2135H, 2160H, and 2170H each corresponding to the auxiliary display area ADA may be provided in the fifth adhesive layer 2129, the first support member 2130, the sixth adhesive layer 2131, the second support member 2140, the seventh adhesive layer 2133, the digitizer 2150, the eighth adhesive layer 2135, the plate 2160, and the cushion layer 2170, respectively, a light transmittance of the auxiliary display area ADA may be improved, and thus, the electronic apparatus 2000 including the electronic module with an improved performance may be provided.

Figure 4A:
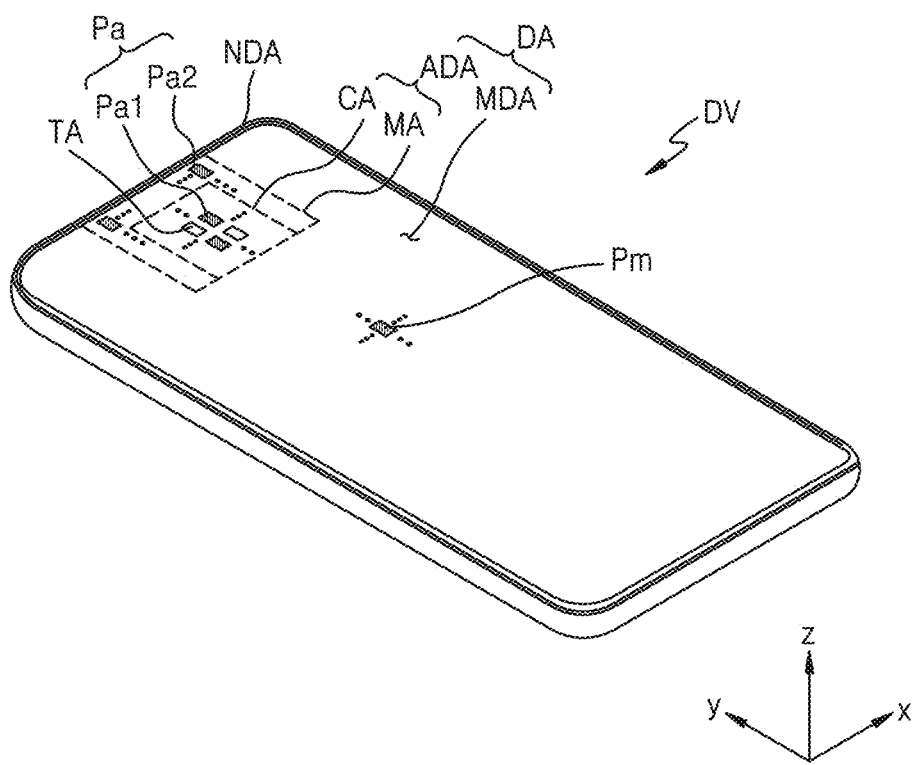
FIGS. 4A and 4B are schematic cross-sectional views of an electronic apparatus according to an embodiment.
Figure 4B:
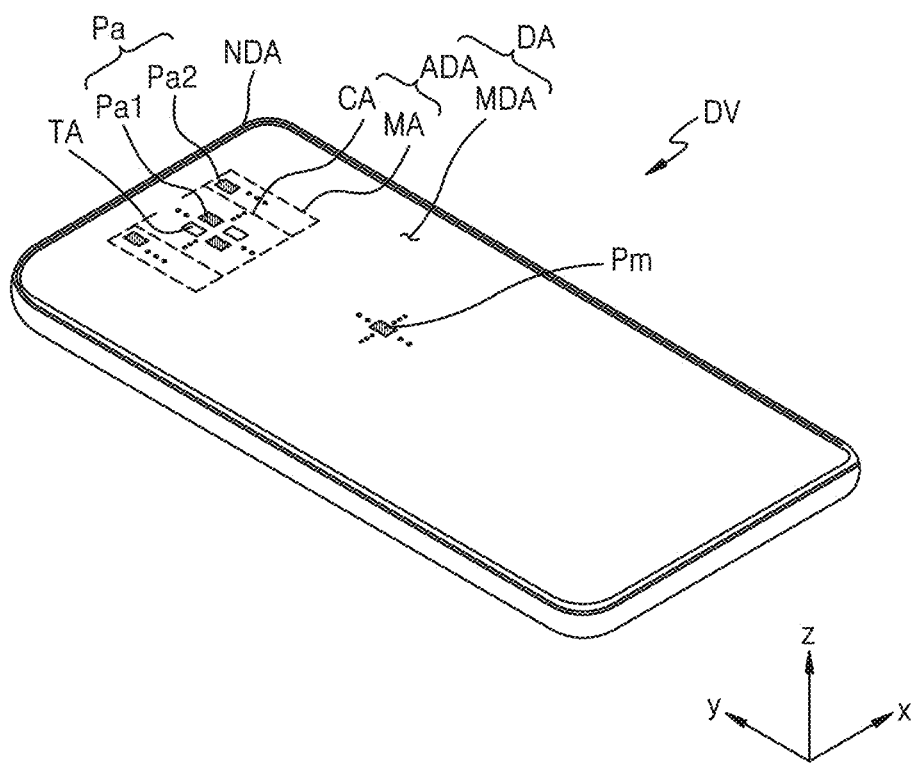

FIGS. 4A and 4B are schematic cross-sectional views of an electronic apparatus according to an embodiment.

Referring to FIGS. 4A and 4B, the display apparatus DV may include the display area DA and the non-display area NDA outside the display area DA. The display area DA may include the auxiliary display area ADA and the main display area MDA at least partially surrounding the auxiliary display area ADA. The auxiliary display area ADA may be configured to display auxiliary images, and the main display area MDA may be configured to display main images. The auxiliary display area ADA and the main display area MDA may be configured to display images individually or in cooperation with each other. The display area DA may be surrounded by the peripheral area NDA entirely.

It is shown in FIGS. 4A and 4B that the main display area MDA is arranged to surround at least a portion of one component area CA. In another embodiment, the display apparatus DV may have two or more auxiliary display areas ADA, and the shapes and sizes of the plurality of auxiliary display areas ADA may be different from one another. When viewed in a direction approximately perpendicular to the upper surface of the display apparatus DV, the shape of the auxiliary display area ADA may be various shapes such as circular shapes, elliptical shapes, polygons such as quadrangles, star shapes, diamond shapes, or the like.

Though it is shown in FIGS. 4A and 4B that the auxiliary display area ADA is arranged on the central upper side (the y direction) of the main display area MDA having an approximately quadrangular shape when viewed in a direction approximately perpendicular to the upper surface of the display apparatus DV, the auxiliary display area ADA may be arranged on one side of the main display area MDA which is quadrangular, for example, the upper right side or upper left side as shown in FIG. 1 or 3A.

The display apparatus DV may display images by using a plurality of main sub-pixels Pm and a plurality of auxiliary sub-pixels Pa, the plurality of main sub-pixels Pm being arranged in the main display area MDA, and the plurality of auxiliary sub-pixels Pa being arranged in the auxiliary display area ADA. The auxiliary display area ADA may include a component area CA and an intermediate area MA that at least partially surrounds the component area CA. Accordingly, the intermediate area MA may be arranged between the component area CA and the main display area MDA.

In FIGS. 4A and 4B, the auxiliary display area ADA may be implemented in various shapes. One side of the auxiliary display area ADA may extend to contact the non-display area NDA as shown in FIG. 1A, and the auxiliary display area ADA may be arranged inside the main display area MDA as shown in FIG. 4B. As described below with reference to FIG. 5A, a component 40 (see FIG. 5A), which is an electronic element, may be arranged below a display panel to correspond to the component area CA. The component 40 (see FIG. 5A) may be a kind of electronic module SS (see FIG. 2A). The component area CA may include a transmission area TA through which light and/or sound that is output from the component 40 to the outside or that progresses toward the component 40 from the outside may pass.

The plurality of auxiliary pixels Pa may be arranged in the auxiliary display area ADA. The auxiliary sub-pixel Pa may include a first auxiliary sub-pixel Pa1 and a second auxiliary sub-pixel Pa2, the first auxiliary sub-pixel Pa1 being arranged in the component area CA, and the second auxiliary sub-pixel Pa2 being arranged in the intermediate area MA.

The plurality of auxiliary sub-pixels Pa may display a preset image by emitting light. The resolution of an image displayed in the auxiliary display area ADA may be equal to or less than the resolution of an image displayed in the main display area MDA. In an embodiment, because the component area CA includes the transmission area TA, the resolution of the component area CA may be less than the resolution of the main display area MDA. As an example, the resolution of the component area CA may be about ½, ⅜, ⅓, ¼, ⅖, ⅛, ⅑, ¹⁄₁₆, or the like of the resolution of the main display area MDA. As an example, the resolution of the main display area MDA may be 400 ppi or more, and the resolution of the component area CA may be about 200 ppi or about 100 ppi. In another embodiment, the resolution of the component area CA may be 400 ppi or more.

In an embodiment, because the component area CA inside the auxiliary display area ADA includes the transmission area TA through which light and sound may pass, in the case where sub-pixels are not arranged in the transmission area TA, the number of first auxiliary sub-pixels Pa1 per unit area in the component area CA may be less than the number of main sub-pixels Pm per unit area in the main area MDA.

Figure 5A:
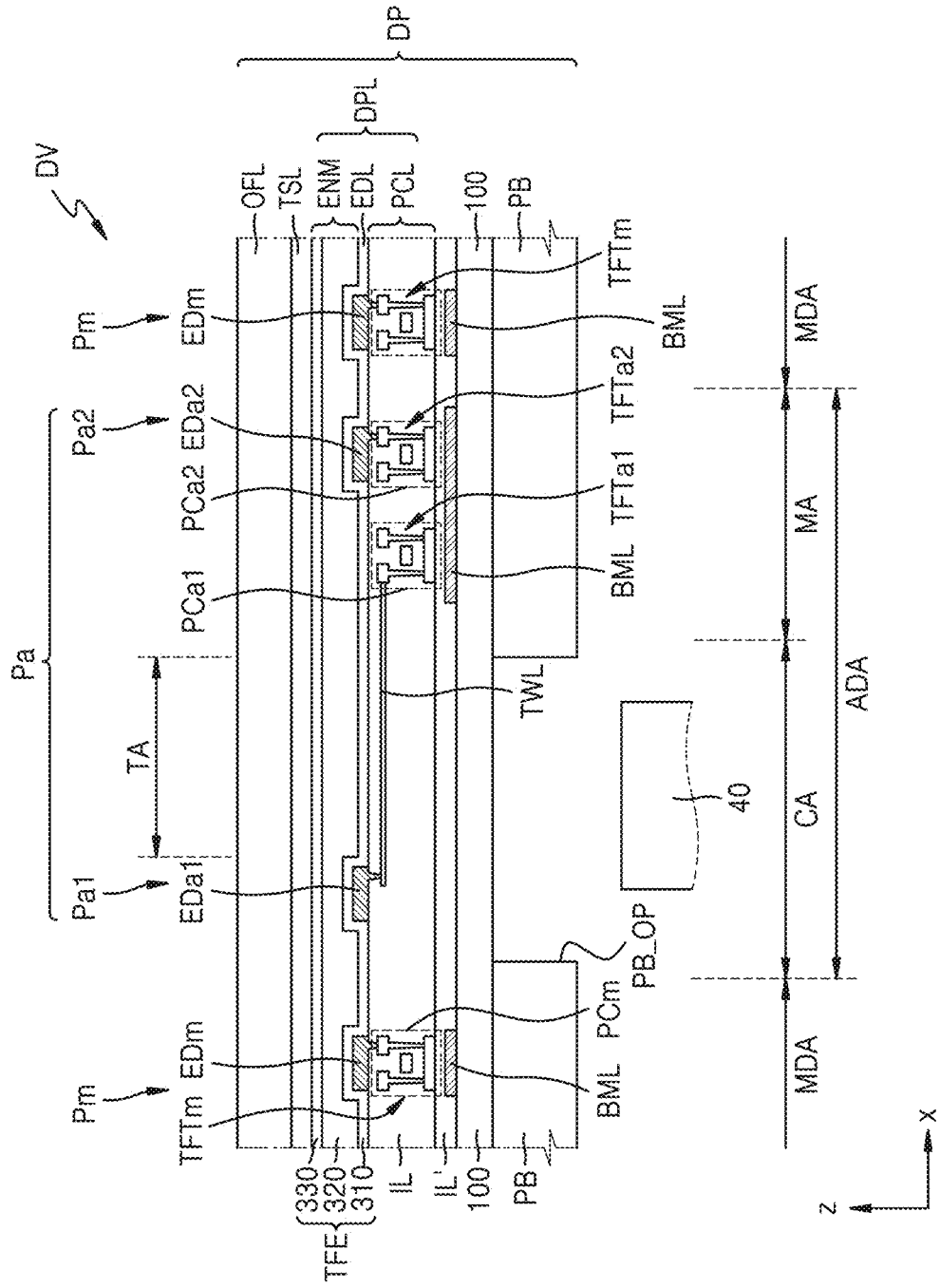
FIGS. 5A and 5B are schematic cross-sectional views of a display apparatus that may be included in an electronic apparatus according to an embodiment.
Figure 5B:
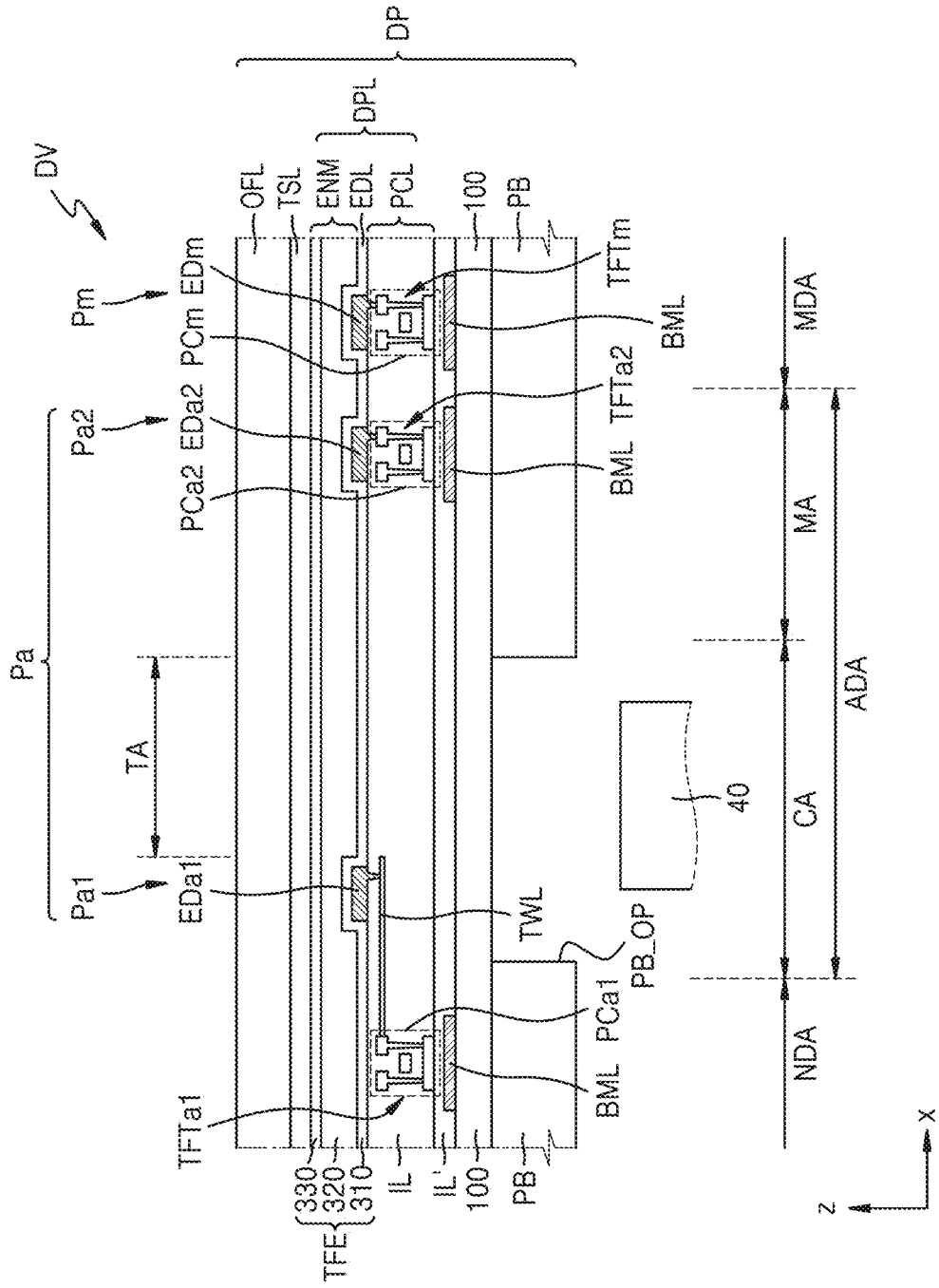

FIGS. 5A and 5B are schematic cross-sectional views of a display apparatus that may be included in an electronic apparatus according to an embodiment.

Referring to FIGS. 5A and 5B, the display apparatus DV may include the display panel DP and the component 40 overlapping the display panel DP in a plan view. The component 40 may be included in the electronic module SS (see FIG. 2A).

The component 40 may be an electronic element that uses light or sound. As an example, the electronic element may be a sensor that measures a distance such as a proximity sensor, a sensor that recognizes a portion of a user's body (e.g., a fingerprint, an iris, a face or the like), a small lamp that outputs light, or an image sensor (e.g., a camera) that captures images. The electronic element that uses light may use light in various wavelength bands such as visible light, infrared light, ultraviolet light or the like. The electronic element that uses sound may use ultrasonic waves or sound in different frequency bands. In an embodiment, the component 40 may include sub-components such as a light-emitter and a light-receiver. The light-emitter and the light-receiver may have a structure integrated in one body, or a pair of the light-emitter and the light-receiver that are physically separated may constitute one component 40.

Assuming that light is allowed to pass through the component area CA, a light transmittance may be 10% or more, more preferably, 40% or more, 25% or more, 50% or more, 85% or more, or 90% or more.

The display panel DP may include the auxiliary display area ADA and the main display area MDA, auxiliary images being displayed in the auxiliary display area ADA, and main images being displayed in the main display area MDA. The auxiliary display area ADA may include the component area CA and the intermediate area MA. The component area CA may overlap the component 40 in a plan view, and the intermediate area MA may surround the component area CA.

The display panel DP may include a substrate 100, a display layer DPL, a touchscreen layer TSL, and an optical functional layer OFL on the substrate 100.

The display layer DPL may include a circuit layer PCL, a display element layer EDL, and an encapsulation member ENM, the circuit layer PCL including thin-film transistors TFTm, TFTa1, and TFTa2, the display element layer EDL including display elements EDm, EDa1, and EDa2 which are light-emitting elements, and the encapsulation member ENM including a thin-film encapsulation layer TFE or an encapsulation substrate (not shown). Insulating layers IL and IL' may be arranged between the substrate 100 and the display layer DPL, and inside the display layer DPL. As an example, the display elements EDm, EDa1, and EDa2 may include a light-emitting diodes, and may be organic light-emitting diodes OLED in an embodiment. Hereinafter, though a light-emitting diode is described as including an organic light-emitting diode, an embodiment according to the invention are not limited thereto. In another embodiment, a display element may be a light-emitting diode including an inorganic material, or a quantum-dot light-emitting diode including quantum dots. As an example, an emission layer of the display element may include an organic material, an inorganic material, quantum dots, an organic material and quantum dots, or an inorganic material and quantum dots.

The substrate 100 may include an insulating material such as glass, quartz, a polymer resin or the like. The substrate 100 may be a rigid substrate or a flexible substrate that is bendable, foldable, and rollable.

A main display element EDm and a main sub-pixel circuit PCm connected thereto may be arranged in the main display area MDA of the display panel DP. The main sub-pixel circuit PCm may include at least one thin-film transistor TFTm and control an operation of the main display element EDm. The main sub-pixels Pm may be implemented by light-emitting of the main display element EDm.

A first auxiliary display element EDa1 may be arranged in the component area CA of the display panel DP to implement the first auxiliary sub-pixel Pa1. In an embodiment, as shown in FIG. 5A, a first auxiliary sub-pixel circuit PCa1 that drives the first auxiliary display element EDa1 may not be arranged in the component area CA but may be arranged in the intermediate area MA between the main display area MDA and the component area CA. In another embodiment, as shown in FIG. 5B, the first auxiliary sub-pixel circuit PCa1 that drives the first auxiliary display element EDa1 may not be arranged in the component area CA but may be arranged in the non-display area NDA. That is, the first auxiliary sub-pixel circuit PCa1 may not overlap the first auxiliary display element EDa1 in a plan view.

The first auxiliary sub-pixel circuit PCa1 may include at least one first auxiliary thin-film transistor TFTa1 and be electrically connected to the first auxiliary light-emitting element by a connection line TWL. The connection line TWL may include a transparent conductive material. The first auxiliary sub-pixel circuit PCa1 may control the first auxiliary display element EDa1. The first auxiliary sub-pixel Pa1 may be implemented by light-emitting of the first auxiliary display element EDa1.

A region of the component area CA in which the first auxiliary display element EDa1 is not arranged may be defined as the transmission area TA. The transmission area TA may be a region through which light/signal emitting from the component 40 or light/signal incident to the component 40 passes, the component 40 being arranged to correspond to the component area CA.

The connection line TWL connecting the first auxiliary sub-pixel circuit PCa1 to the first auxiliary display element EDa1 may be arranged in the transmission area TA. Because the connection line TWL may include a transparent conductive material having a high transmittance, even though the connection line TWL is arranged in the transmission area TA, a transmittance of the transmission area TA may be secured. In the present embodiment, because the auxiliary sub-pixel circuit PCa is not arranged in the component area CA, it is easy to extend the area of the transmission area TA and a light transmittance may be improved even more.

A second auxiliary display element EDa2 and a second auxiliary sub-pixel circuit PCa2 connected thereto may be arranged in the intermediate area MA of the display panel DP to implement the second auxiliary sub-pixel Pa2. The first auxiliary sub-pixel circuit PCa1 and the second auxiliary sub-pixel circuit PCa2 in the intermediate area MA may be adjacent to each other and alternately arranged.

As shown in FIGS. 5A and 5B, the display element layer EDL may be covered by the thin-film encapsulation layer TFE or the encapsulation substrate. In an embodiment, the thin-film encapsulation layer TFE may include at least one inorganic encapsulation layer and at least one organic encapsulation layer. As an example, the thin-film encapsulation layer TFE may include a first inorganic encapsulation layer 310, a second inorganic encapsulation layer 330, and an organic encapsulation layer 320.

The first inorganic encapsulation layer 310 and the second inorganic encapsulation layer 330 may each include at least one inorganic insulating material such as silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$), and be formed by chemical vapor deposition (CVD). The organic encapsulation layer 320 may include a polymer-based material. The polymer-based material may include an acryl-based resin (e.g., polymethylmethacrylate, poly acrylic acid, or the like), an epoxy-based resin, polyimide, and polyethylene.

The first inorganic encapsulation layer 310, the organic encapsulation layer 320, and the second inorganic encapsulation layer 330 may each be formed as one body to cover the main display area MDA and the auxiliary display area ADA.

The touchscreen layer TSL may obtain coordinate information corresponding to an external input, for example, a touch event. The touchscreen layer TSL may include a touch electrode and touch wirings connected to the touch electrode. The touchscreen layer TSL may sense an external input by using a self-capacitance method or a mutual capacitance method.

The touchscreen layer TSL may be arranged on the thin-film encapsulation layer TFE. Alternatively, the touchscreen layer TSL may be separately formed on a touch substrate and then coupled on the thin-film encapsulation layer TFE through an adhesive layer such as an optically clear adhesive OCA. In an embodiment, the touchscreen layer TSL may be formed directly on the thin-film encapsulation layer TFE. In this case, an adhesive layer may not be arranged between the touchscreen layer TSL and the thin-film encapsulation layer TFE.

The optical functional layer OFL may include an anti-reflection layer. The anti-reflection layer may reduce reflectivity of light (external light) incident toward the display apparatus DV from outside. In an embodiment, the optical functional layer OFL may be a polarizing film. In another embodiment, the optical functional layer OFL may define an opening (not shown) therein corresponding to the transmission area TA. Accordingly, a light transmittance of the transmission area TA may be remarkably improved. A transparent material such as an optically clear resin (OCR) may fill the opening. In another embodiment, the optical functional layer OFL may be a filter plate including a black matrix and color filters.

A panel protection member PB may be attached under the substrate 100 to support and protect the substrate 100. The panel protection member PB may define an opening PB_OP corresponding to the component area CA. Because the panel protection member PB defines the opening PB_OP, a light transmittance of the component area CA may be improved.

The panel protection member PB may include polyethylene terephthalate or polyimide. The area of the component area CA may be greater than an area in which the component 40 is arranged. Accordingly, the area of the opening PB_OP of the panel protection member PB may not coincide with the area of the component area CA. Though it is shown in FIGS. 5A and 5B that the component 40 is apart on one side of the display panel DP, at least a portion of the component 40 may be inserted to the opening PB_OP of the panel protection member PB.

One or a plurality of components 40 may be arranged in the component area CA. The plurality of components 40 may have different functions. As an example, the components 40 may include at least two among a camera (a photographing element), a solar battery, a flash, a proximity sensor, an illuminance sensor, and an iris sensor.

In addition, as shown in FIGS. 5A and 5B, a bottom metal layer BML may be arranged below the first auxiliary sub-pixel circuit PCa1 and/or the second auxiliary sub-pixel circuit PCa2 in the intermediate area MA. The bottom metal layer BML may overlap the sub-pixel circuits to protect the sub-pixel circuits. In an embodiment, the bottom metal lay BML may overlap the first auxiliary sub-pixel circuit PCa1 and/or the second auxiliary sub-pixel circuit PCa2 between the substrate 100 and the first auxiliary sub-pixel circuit PCa1 and/or the second auxiliary sub-pixel circuit PCa2 in a plan view. The bottom metal layer BML may block external light reaching the first auxiliary sub-pixel circuit PCa1 and/or the second auxiliary sub-pixel circuit PCa2. In addition, the bottom metal layer BML may be arranged also below the main sub-pixel circuit PCm of the main display area MDA. The bottom metal layer BML arranged below the main sub-pixel circuit PCm may be apart from the bottom metal layer BML arranged below the first auxiliary sub-pixel circuit PCa1 and/or the second auxiliary sub-pixel circuit PCa2. In another embodiment, the bottom metal layer BML may be provided to correspond to the display area DA entirely and may include a bottom-hole corresponding to the component area CA. In another embodiment, the bottom metal layer BML may be omitted.

Figure 6A:
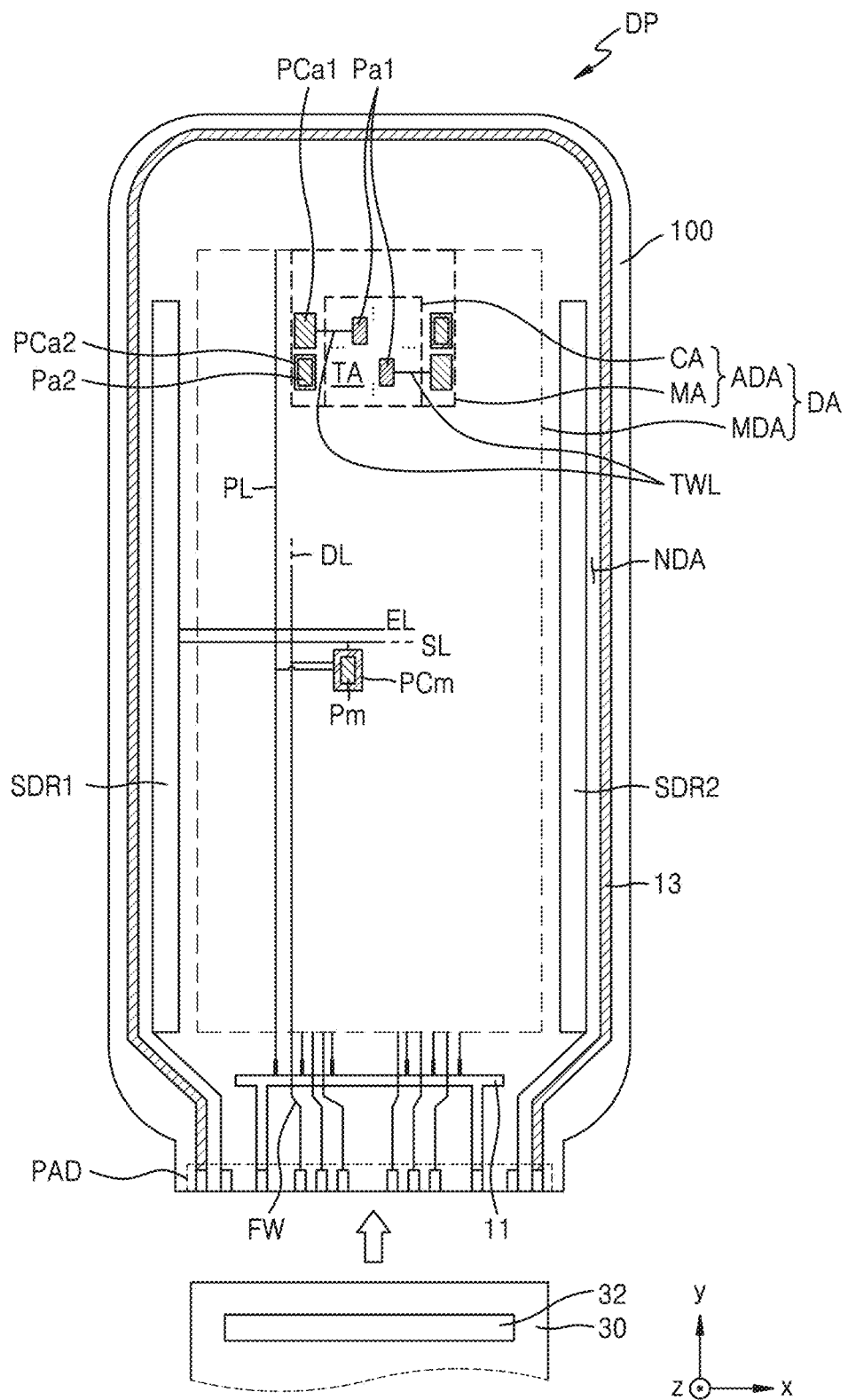
FIGS. 6A and 6B are schematic plan views of a display panel that may be included in a display apparatus according to an embodiment.
Figure 6B:
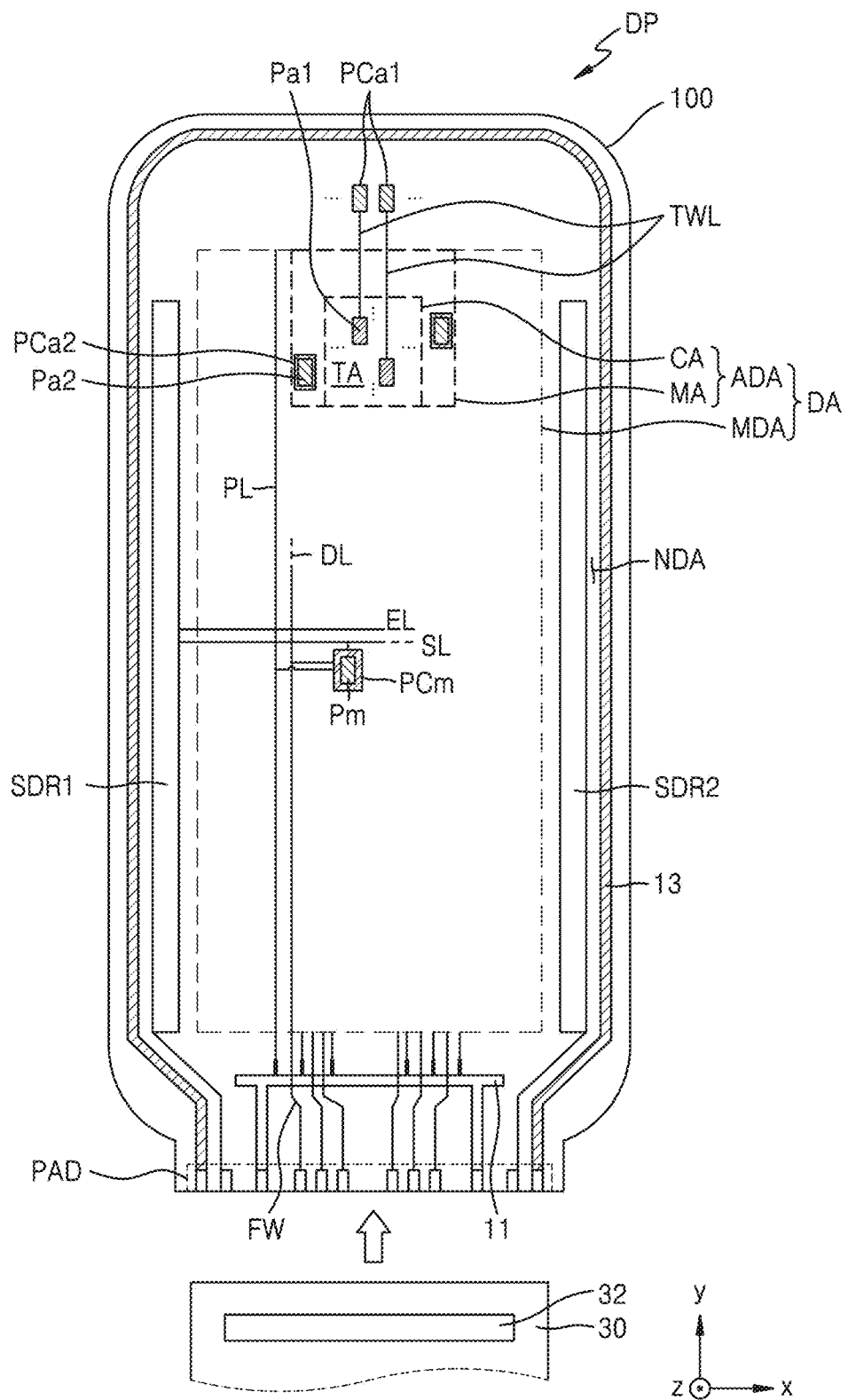

FIGS. 6A and 6B are schematic plan views of the display panel DP provided to the display apparatus according to an embodiment.

Referring to FIGS. 6A and 6B, various kinds of elements constituting the display panel DP are arranged over the substrate 100.

A plurality of main sub-pixels Pm are arranged in the main display area MDA. The plurality of main sub-pixels Pm may each be implemented as a light-emitting element by a display element such as an organic light-emitting diode OLED. The main sub-pixel circuit PCm that drives the main sub-pixel Pm may be arranged in the main display area MDA, and may overlap the main sub-pixel Pm in a plan view. Each main sub-pixel Pm may emit, for example, red, green, blue, or white light. The main display area MDA may be protected from external air, moisture, or the like by being covered by the encapsulation member.

As described above, the auxiliary display area ADA may be arranged on one side of the main display area MDA, or arranged inside the display area DA and thus surrounded by the main display area MDA. The plurality of auxiliary sub-pixels, that is, the first auxiliary sub-pixel Pa1 and the second auxiliary sub-pixel Pa2 may be arranged in the auxiliary display area ADA. The plurality of auxiliary sub-pixels, that is, the first auxiliary sub-pixel Pa1 and the second auxiliary sub-pixel Pa2 may each be implemented as a light-emitting element by a display element such as an organic light-emitting diode. Each auxiliary sub-pixel Pa may emit, for example, red, green, blue, or white light. The auxiliary display area ADA may be protected from external air, moisture, or the like by being covered by the encapsulation member.

The auxiliary display area ADA may include the component area CA and the intermediate area MA that at least partially surrounds the component area CA. The first auxiliary sub-pixel Pa1 may be implemented in the component area CA, and the second auxiliary sub-pixel Pa2 may be implemented in the intermediate area MA. This may mean that the first auxiliary sub-pixel Pa1 substantially emits light in the component area CA, and the second auxiliary sub-pixel Pa2 substantially emits light in the intermediate area MA.

Referring to FIG. 6A, because the first auxiliary display element EDa1 (see FIG. 5A) that implements the first auxiliary sub-pixel Pa1 is arranged in the component area CA, the first auxiliary sub-pixel circuit PCa1 is arranged in the intermediate area MA, the first auxiliary display element EDa1 (see FIG. 5A) may be connected to the first auxiliary sub-pixel circuit PCa1 by the connection line TWL.

Referring to FIG. 6B, because the first auxiliary display element EDa1 (see FIG. 5B) that implements the first auxiliary sub-pixel Pa1 is arranged in the component area CA, the first auxiliary sub-pixel circuit PCa1 is arranged in the non-display area NDA, the first auxiliary display element EDa1 (see FIG. 5B) may be connected to the first auxiliary sub-pixel circuit PCa1 by the connection line TWL.

Referring to FIGS. 6A and 6B, the first auxiliary display element EDa1 (see FIG. 5A) is arranged in the component area CA, but the first auxiliary sub-pixel circuit PCa1 electrically connected to the first auxiliary display element EDa1 (see FIG. 5A) is not arranged in the component area CA. As a comparative example, in the case where the first auxiliary sub-pixel circuit PCa1 including transistors and a storage capacitor connected to various kinds of signal lines and voltage lines is arranged in the component area CA, it may be difficult to sufficiently secure the area of the transmission area TA due to the presence of the first auxiliary sub-pixel circuit PCa1. In contrast, according to an embodiment, because the first auxiliary sub-pixel circuit PCa1 is arranged in the intermediate area MA or the non-display area NDA, and the first auxiliary display element EDa1 (see FIG. 5A) is arranged in the component area CA, the resolution of the component area CA may be maintained and the area of the transmission area TA may be increased.

The pixel circuits PCm, PCa1, and PCa2 that drive the pixels Pm, Pa1, and Pa2 in the display area DA may each be electrically connected to outer circuits arranged in the peripheral area NDA. A first scan driving circuit SDR1, a second scan driving circuit SDR2, a terminal part PAD, a driving voltage supply line 11, and a common voltage supply line 13 may be arranged in the peripheral area NDA.

The first scan driving circuit SDR1 may apply scan signals to the main sub-pixel circuit PCm that drives the main sub-pixel Pm through a scan line SL. In addition, the first scan driving circuit SDR1 may apply an emission control signal to each pixel circuit through an emission control line EL. The second scan driving circuit SDR2 may be arranged symmetrical with the first scan driving circuit SDR1 around the main display area MDA. A portion of the main sub-pixel circuit PCm of the main sub-pixel Pm in the main display area MDA may be electrically connected to the first scan driving circuit SDR1, and the rest may be electrically connected to the second scan driving circuit SDR2.

The terminal part PAD may be arranged on one side of the substrate 100. The terminal part PAD may be exposed and connected to a display circuit board 30 by not being covered by an insulating layer. A display driver 32 may be arranged on the display circuit board 30.

The display driver 32 may be configured to generate control signals transferred to the first scan driving circuit SDR1 and the second scan driving circuit SDR2. The display driver 32 may be configured to generate a data signal, and the generated data signal may be transferred to the main sub-pixel circuit PCm through a fan-out wiring FW and a data line DL connected to the fan-out wiring FW.

The display driver 32 may be configured to supply a driving voltage ELVDD to the driving voltage supply line 11 and supply a common voltage ELVSS to the common voltage supply line 13. The driving voltage ELVDD may be applied to the pixel circuits of the sub-pixels Pm and Pa through a driving voltage line PL connected to the driving voltage supply line 11, and the common voltage ELVSS may be applied to an opposite electrode of the display element through the common voltage supply line 13.

The driving voltage supply line 11 may extend in the x direction below the main display area MDA. The common voltage supply line 13 may have a loop shape having one open side to partially surround the main display area MDA.

Figure 7:
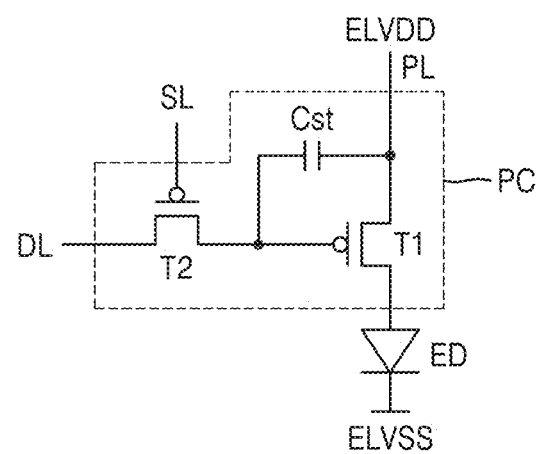
FIG. 7 is a schematic equivalent circuit diagram of a display element of a display apparatus and a pixel circuit electrically connected thereto according to an embodiment.

FIG. 7 is a schematic equivalent circuit diagram of the display element of the display apparatus and the sub-pixel circuit PC electrically connected thereto according to an embodiment.

The sub-pixel circuit PC shown in FIG. 7 may correspond to each of the main sub-pixel circuit PCm, the first auxiliary sub-pixel circuit PCa1, and the second auxiliary sub-pixel circuit PCa2 described above with reference to FIGS. 6A and 6B.

The display element ED shown in FIG. 7 may correspond to each of the main display element EDm, the first auxiliary display element EDa1, and the second auxiliary display element EDa2 described above with reference to FIGS. 6A and 6B. In an embodiment, the display element ED may be an organic light-emitting diode.

Referring to FIG. 7, the sub-pixel circuit PC may include a driving thin-film transistor T1, a switching thin-film transistor T2, and a storage capacitor Cst.

The switching thin-film transistor T2 is electrically connected to the scan line SL and the data line DL, and configured to transfer a data voltage or a data signal to the driving thin-film transistor T1 according to a switching voltage or a switching signal input from the scan line SL, the data voltage or the data signal being input from the data line DL. The storage capacitor Cst may be electrically connected to the switching thin-film transistor T2 and the driving voltage line PL and configured to store a voltage corresponding to a difference between a voltage transferred from the switching thin-film transistor T2 and the driving voltage ELVDD supplied to the driving voltage line PL.

The driving thin-film transistor T1 may be electrically connected to the driving voltage line PL and the storage capacitor Cst and configured to control a driving current according to the voltage stored in the storage capacitor Cst, the driving current flowing from the driving voltage line PL to the display element ED. The display element ED may emit light having a preset brightness based on the driving current. The opposite electrode of the display element ED may receive the common voltage ELVSS.

Though it is shown in FIG. 7 that the sub-pixel circuit PC includes two thin-film transistors and one storage capacitor, the sub-pixel circuit PC may include three or more thin-film transistors.

Figure 8:
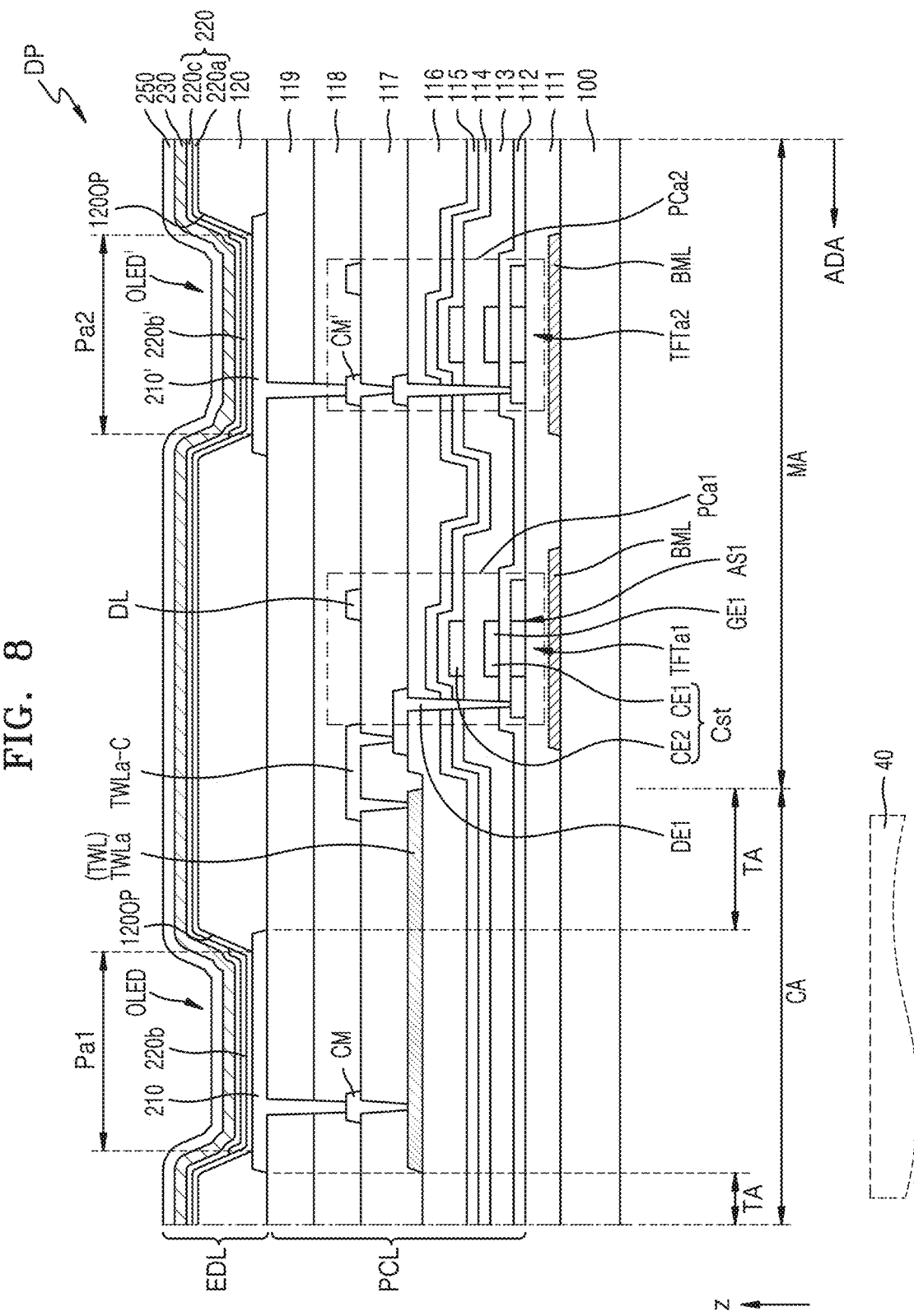
FIG. 8 is a schematic cross-sectional view of a portion of a display panel that may be included in a display apparatus according to an embodiment.

FIG. 8 is a schematic perspective view of a display panel according to an embodiment.

Referring to FIG. 8, the first auxiliary sub-pixel Pa1 may be arranged in the component area CA of the auxiliary display area ADA, and the second auxiliary sub-pixel Pa2 may be arranged in the intermediate area MA of the auxiliary display area ADA. The first auxiliary sub-pixel Pa1 corresponds to an emission area of the display element, for example, an organic light-emitting diode OLED corresponding to the first auxiliary sub-pixel Pa1, and the second auxiliary sub-pixel Pa2 corresponds to an emission area of the display element, for example, an organic light-emitting diode OLED' corresponding to the second auxiliary sub-pixel Pa2.

The first auxiliary sub-pixel circuit PCa1 and the second auxiliary sub-pixel circuit PCa2 may be arranged in the intermediate area MA. The first auxiliary sub-pixel circuit PCa1 and the second auxiliary sub-pixel circuit PCa2 may be adjacent to each other. For convenience of description, it is shown that the first auxiliary sub-pixel circuit PCa1 and the second auxiliary sub-pixel circuit PCa2 include a first auxiliary thin-film transistor TFTa1 and a second auxiliary thin-film transistor TFTa2, respectively.

Because the first auxiliary thin-film transistor TFTa1 has the same structure as a structure of the second auxiliary thin-film transistor TFTa2, the first auxiliary thin-film transistor TFTa1 is described below as a reference.

The organic light-emitting diode OLED corresponding to the first auxiliary sub-pixel Pa1 may be connected to the first auxiliary sub-pixel circuit PCa1 through the connection line TWL. One side of the connection line TWL may be connected to the first auxiliary sub-pixel circuit PCa1, and another side may be connected to a first electrode 210 of the organic light-emitting diode OLED which is the display element. A contact electrode CM may be arranged between the connection line TWL and the first electrode 210, and thus, the connection line TWL may be electrically connected to the first electrode 210 through the contact electrode CM.

In an embodiment, as shown in FIG. 8, the connection line TWL may include a light transmissive conductive layer TWLa arranged on a third interlayer-insulating layer 116. The light transmissive conductive layer TWLa may be connected to the first auxiliary sub-pixel circuit PCa1 through a conductive line TWLa-C. In another embodiment, the light transmissive conductive layer TWLa may be directly connected to the first auxiliary sub-pixel circuit PCa1 without including the conductive line TWLa-C.

The substrate 100 may include glass or a polymer resin such as polyethersulfone, polyarylate, polyetherimide, polyethylene naphthalate, polyethylene terephthalate, polyphenylene sulfide, polyimide, polycarbonate, cellulose tri acetate, cellulose acetate propionate, or the like. In an embodiment, the substrate 100 may have a multi-layered structure including a base layer (not shown) and a barrier layer (not shown) each including the polymer resin. The substrate 100 including the polymer resin is flexible, rollable, and bendable.

The pixel circuit layer PCL may be arranged on the substrate 100. The pixel circuit layer PCL may include the first auxiliary sub-pixel circuit PCa1, the second auxiliary sub-pixel circuit PCa2, and insulating layers. In an embodiment, the insulating layers are inorganic insulating layers and may include a buffer layer 111, a first gate insulating layer 112, a second gate insulating layer 113, a first interlayer-insulating layer 114, a second interlayer-insulating layer 115, and a third interlayer-insulating layer 116. In an embodiment, the insulating layers are organic insulating layers and may include a first organic insulating layer 117, a second organic insulating layer 118, and a third organic insulating layer 119.

The first auxiliary sub-pixel circuit PCa1 may include the first auxiliary thin-film transistor TFTa1 and the storage capacitor Cst. The first auxiliary thin-film transistor TFTa1 may include a first semiconductor layer AS1, a first gate electrode GE1, a first source electrode SE1, and a first drain electrode DE1. The storage capacitor Cst may include a lower electrode CE1 and an upper electrode CE2. The first auxiliary thin-film transistor TFTa1 may serve as a driving thin-film transistor.

The buffer layer 111 may be arranged on the substrate 100. The buffer layer 111 may include an inorganic insulating material such as silicon nitride ($SiN_x$), silicon oxynitride (SiON), and silicon oxide ($SiO_x$), and include a single layer or a multi-layer including the inorganic insulating materials.

The bottom metal layer BML may be arranged between the substrate 100 and the buffer layer 111. The bottom metal layer BML may overlap the first auxiliary sub-pixel circuit PCa1 below the first auxiliary sub-pixel circuit PCa1 to protect the first auxiliary sub-pixel circuit PCa1. The bottom metal layer BML may include a reflective metal, for example, silver (Ag), molybdenum (Mo), aluminum (Al), aluminum nitride (AlN), tungsten (W), tungsten nitride (WN), copper (Cu), titanium (Ti), silicon (Si) or the like.

The first semiconductor layer AS1 may include a silicon semiconductor. The first semiconductor layer AS1 may include polycrystalline silicon. Alternatively, the first semiconductor layer AS1 may include amorphous silicon. In an embodiment, the first semiconductor layer AS1 may include an oxide semiconductor, an organic semiconductor or the like. The first semiconductor layer AS1 may include a channel region, a drain region, and a source region, the drain region and the source region being on two opposite sides of the channel region. The first gate electrode GE1 may overlap the channel region.

The first gate electrode G1 may overlap the first semiconductor layer AS1 in a plan view. The first gate electrode GE1 may include a low-resistance metal material. The first gate electrode GE1 may include a conductive material including molybdenum (Mo), aluminum (Al), copper (Cu), and titanium (Ti) and have a single-layered structure or a multi-layered structure including the above materials.

The first gate insulating layer 112 may be arranged between the first semiconductor layer AS1 and the first gate electrode GE1. Accordingly, the first semiconductor layer AS1 may be insulated from the first gate electrode GE1. The first gate insulating layer 112 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO).

The second gate insulating layer 113 may cover the first gate electrode GE1. The second gate insulating layer 113 may be arranged on the first gate electrode GE1. Similar to the first gate insulating layer 112, the second gate insulating layer 113 may include an inorganic insulating material including silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO).

The upper electrode CE2 may be arranged on the second gate insulating layer 113. The upper gate electrode CE2 may overlap the first gate electrode GE1 therebelow. In this case, the upper electrode CE2 may overlap the first gate electrode GE1 with the second gate insulating layer 113 therebetween to constitute the storage capacitor Cst. That is, the first gate electrode GE1 of the first auxiliary thin-film transistor TFTa1 may serve as the lower electrode CE1 of the storage capacitor Cst.

As described above, the storage capacitor Cst may overlap the first auxiliary thin-film transistor TFTa1. In an embodiment, the storage capacitor Cst may not overlap the first auxiliary thin-film transistor TFTa1 in a plan view.

The upper electrode CE2 may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu), and include a single layer or a multi-layer including the above materials.

The first interlayer-insulating layer 114 and the second interlayer-insulating layer 115 may cover the upper electrode CE2. In an embodiment, the first interlayer-insulating layer 114 and the second interlayer-insulating layer 115 may cover the first gate electrode GE1. The first interlayer-insulating layer 114 and the second interlayer-insulating layer 115 may each include an inorganic insulating material including silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). The first interlayer-insulating layer 114 and the second interlayer-insulating layer 115 may each include a single layer or a multi-layer including the above inorganic insulating materials.

The first source electrode (not shown) and the first drain electrode DE1 may be arranged on the third interlayer-insulating layer 116. The first source electrode (not shown) and the first drain electrode DE1 may be connected to the first semiconductor layer AS1. The first source electrode and the first drain electrode DE1 may be connected to the first semiconductor layer AS1 through contact holes of the insulating layers.

The first source electrode and the first drain electrode DE1 may each include a conductive material including molybdenum (Mo), aluminum (Al), copper (Cu), and titanium (Ti) and have a single-layered structure or a multi-layered structure including the above materials. In an embodiment, the source electrode (not shown) and the first drain electrode DE1 may each have a multi-layered structure of Ti/Al/Ti.

The first organic insulating layer 117 may cover the first source electrode (not shown) and the first drain electrode DE1. The data line DL transferring data signals and the driving voltage line (not shown) transferring the driving voltage may be arranged on the first organic insulating layer 117. The first source electrode (not shown) and the first drain electrode DE1 may be connected to the data line DL or the driving voltage line (not shown) directly or through another thin-film transistor.

In addition, the conductive line TWLa-C connected to the first source electrode (not shown) and the first drain electrode DE1 may be arranged on the first organic insulating layer 117, and the contact electrode CM connected to the conductive line TWLa-C through the connection line TWL may be arranged on the first organic insulating layer 117.

The second organic insulating layer 118 and the third organic insulating layer 119 may cover the conductive line TWLa-C and the contact electrode CM. The first organic insulating layer 117, the second organic insulating layer 118, and the third organic insulating layer 119 may include an organic insulating material, for example, a general-purpose polymer such as benzocyclobutene ("BCB"), polyimide, hexamethyldisiloxane ("HMDSO"), polymethylmethacrylate ("PMMA") or polystyrene ("PS"), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

The display element layer EDL may be arranged on the pixel circuit layer PCL. The display element layer EDL may include a display element. In an embodiment, the display element layer EDL may include an organic light-emitting diode OLED as a display element arranged in the component area CA.

The organic light-emitting diode OLED may be arranged on the third organic insulating layer 119. The organic light-emitting diode OLED as a display element may be electrically connected to the first auxiliary sub-pixel circuit PCa1 to implement the first auxiliary sub-pixel Pa1. The organic light-emitting diode OLED may include the first electrode 210, an intermediate layer 220, and a second electrode 230, the intermediate layer 230 including an organic emission layer, and the second electrode 230 facing the first electrode 210.

The first electrode 210 may be a pixel electrode. The first electrode 210 may be electrically connected to the connection electrode CM through a contact hole of the first organic insulating layer 117. The first electrode 210 may be a reflective electrode. In an embodiment, the first electrode 210 may include a reflective layer and a transparent or semi-transparent electrode layer on the reflective layer, the reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. The transparent or semi-transparent electrode layer may include at least one of indium tin oxide ("ITO"), indium zinc oxide ("IZO"), zinc oxide (ZnO), indium oxide ($In_2O_3$), indium gallium oxide ("IGO"), and aluminum zinc oxide ("AZO"). As an example, the first electrode 210 may have a multi-layered structure of ITO/Ag/ITO.

A bank layer 120 may be arranged on the third organic insulating layer 119. The bank layer 120 may prevent arcs or the like from occurring at the edges of the first electrode 210 by increasing a distance between the edges of the first electrode 210 and the second electrode 230 over the first electrode 210.

The bank layer 120 may include an organic insulating material such as polyimide, an acrylic resin, benzocyclobutene, a phenolic resin, or the like and be formed by using spin coating or the like. The bank layer 120 may be transparent or may have a black color by including a light-blocking material.

The intermediate layer 220 of the organic light-emitting diode OLED may be arranged inside an opening 1200P formed by the bank layer 120. An emission area of the organic light-emitting diode OLED may be defined by the opening 1200P of the bank layer 120.

The intermediate layer 220 may include an emission layer 220b. The emission layer 220b may include an organic material including a fluorescent or phosphorous material emitting red, green, blue, or white light. The emission layer 220b may include a low-molecular weight organic material or a polymer organic material. A first functional layer 220a and a second functional layer 220c may be selectively further arranged under and on the emission layer 220b, the first functional layer 220a including a hole transport layer ("HTL") and a hole injection layer ("HIL"), and the second functional layer 220c including an electron transport layer ("ETL") and an electron injection layer ("EIL").

The first electrode 230 may be a reflective electrode. In an embodiment, the second electrode 230 may include a metal thin film having a small work function including at least one of Li, Ca, LiF/Ca, LiF/Al, Al, Ag, Mg, and a compound thereof. In addition, a transparent conductive oxide ("TCO") such as ITO, IZO, ZnO, or $In_2O_3$ may be further arranged on the metal thin film. The second electrode 230 may be formed as one body over the entire surface of the display area DA and arranged on the intermediate layer 220 and the bank layer 120.

An upper layer 250 including an organic material may be formed on the second electrode 230. The upper layer 250 may be a layer for protecting the second electrode 230 and simultaneously increasing a light-extracting efficiency. The upper layer 250 may include an organic material having a higher refractive index than a refractive index of the second electrode 230. In addition, the upper layer 250 may include layers of different refractive indexes that are stacked. As an example, the upper layer 250 may include a high refractive index layer/a low refractive index layer/a high refractive index layer that are stacked. In this case, the refractive index of the high refractive index layer may be 1.7 or more, and the refractive index of the low refractive index layer may be 1.3 or less.

The upper layer 250 may additionally include lithium fluoride (LiF). Alternatively, the upper layer 250 may additionally include an inorganic insulating material such as silicon oxide ($SiO_x$) and silicon nitride ($SiN_x$).

Referring to FIG. 8, the second electrode 230 may be formed as one body to correspond to organic light-emitting diodes OLED and OLED' corresponding to the plurality of pixels, for example, the first and second sub-pixels Pa1 and Pa2. Because the second electrode 230 includes a semi-transmissive metal, the transmittance of the component area CA may be reduced by the second electrode 230. To prevent the reduction of the transmittance of the component area CA, the second electrode 230 may define an opening arranged in the component area CA as described below with reference to FIG. 9.

Figure 9:
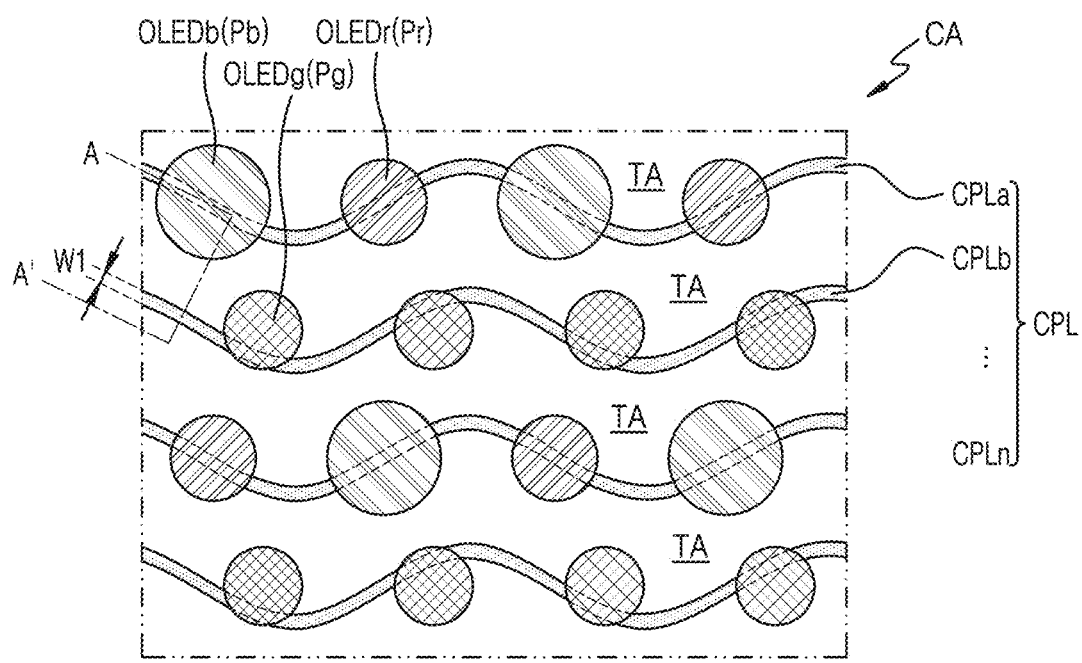
FIG. 9 is a schematic plan view of a shield pattern in a component area and a display element on the shield pattern in a display apparatus according to an embodiment.
Figure 10:
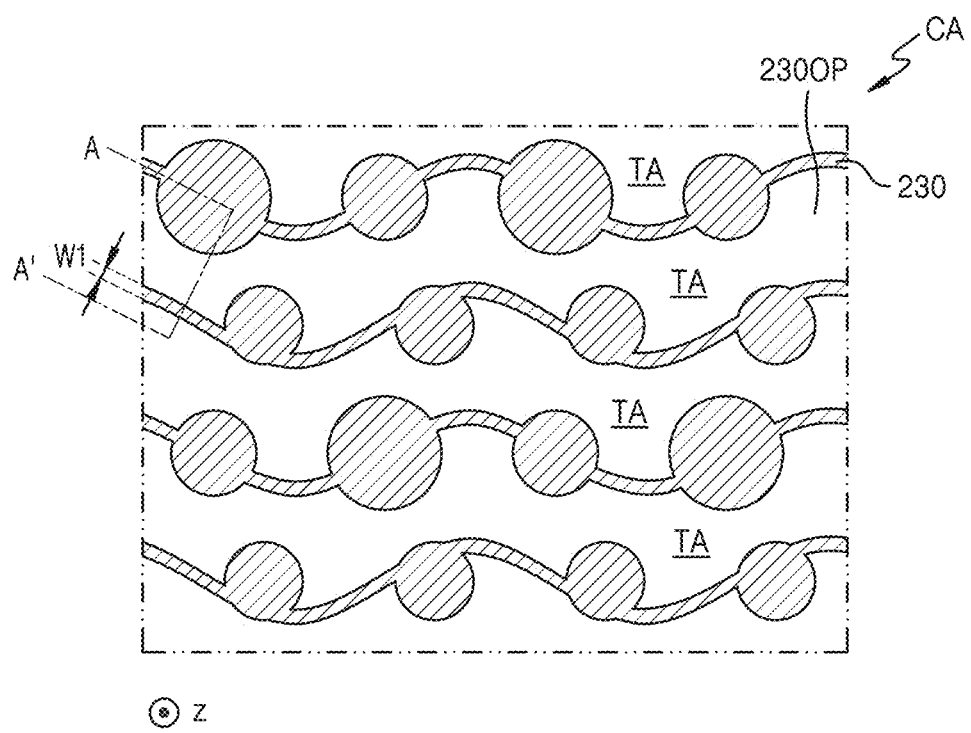
FIG. 10 is a schematic plan view of a second electrode of a component area in a display apparatus according to an embodiment.
Figure 11:
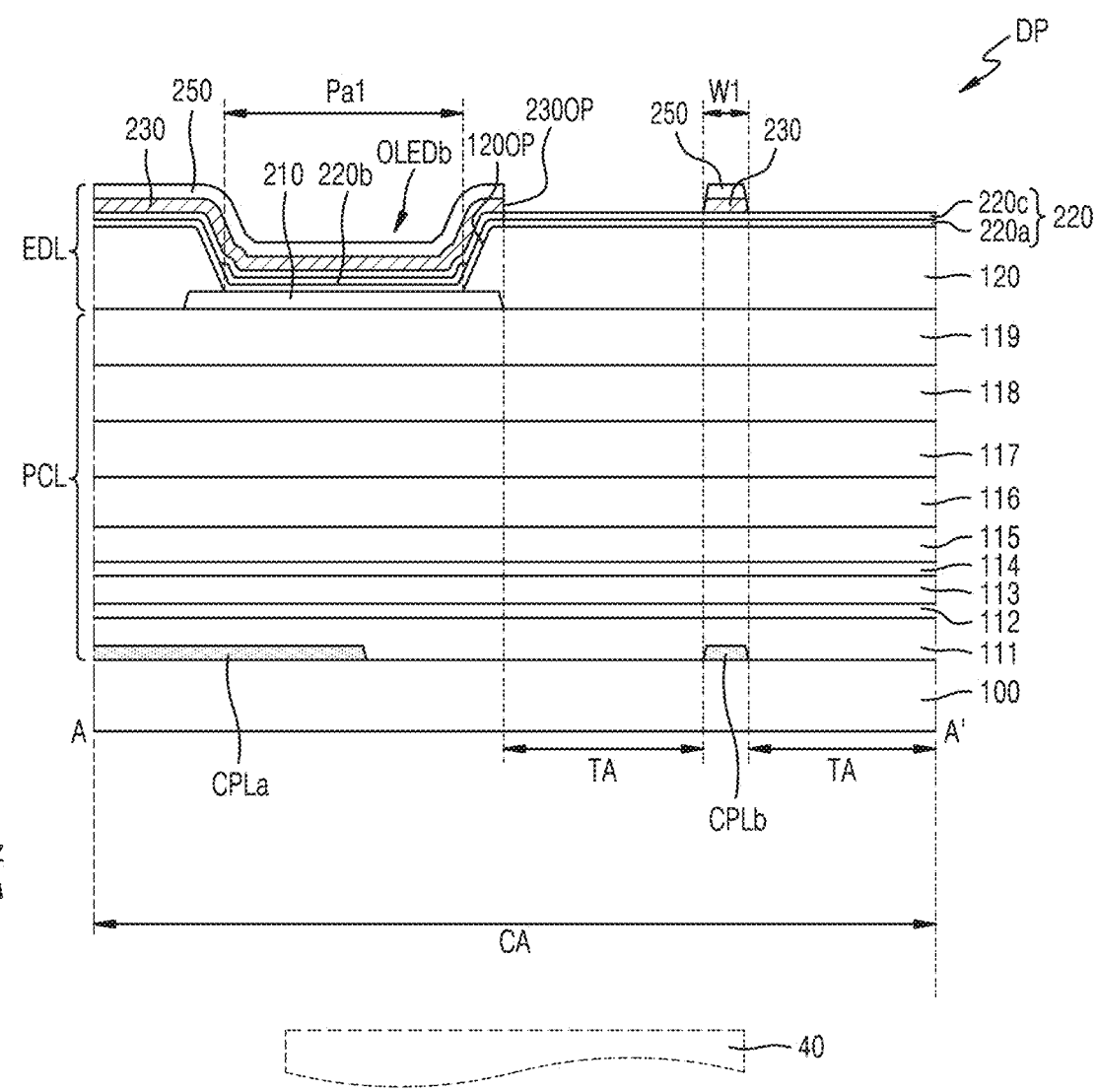
FIGS. 11, 12, 13, 14 and 15 are schematic cross-sectional views of a portion of a component area in a display apparatus according to an embodiment.
Figure 12:
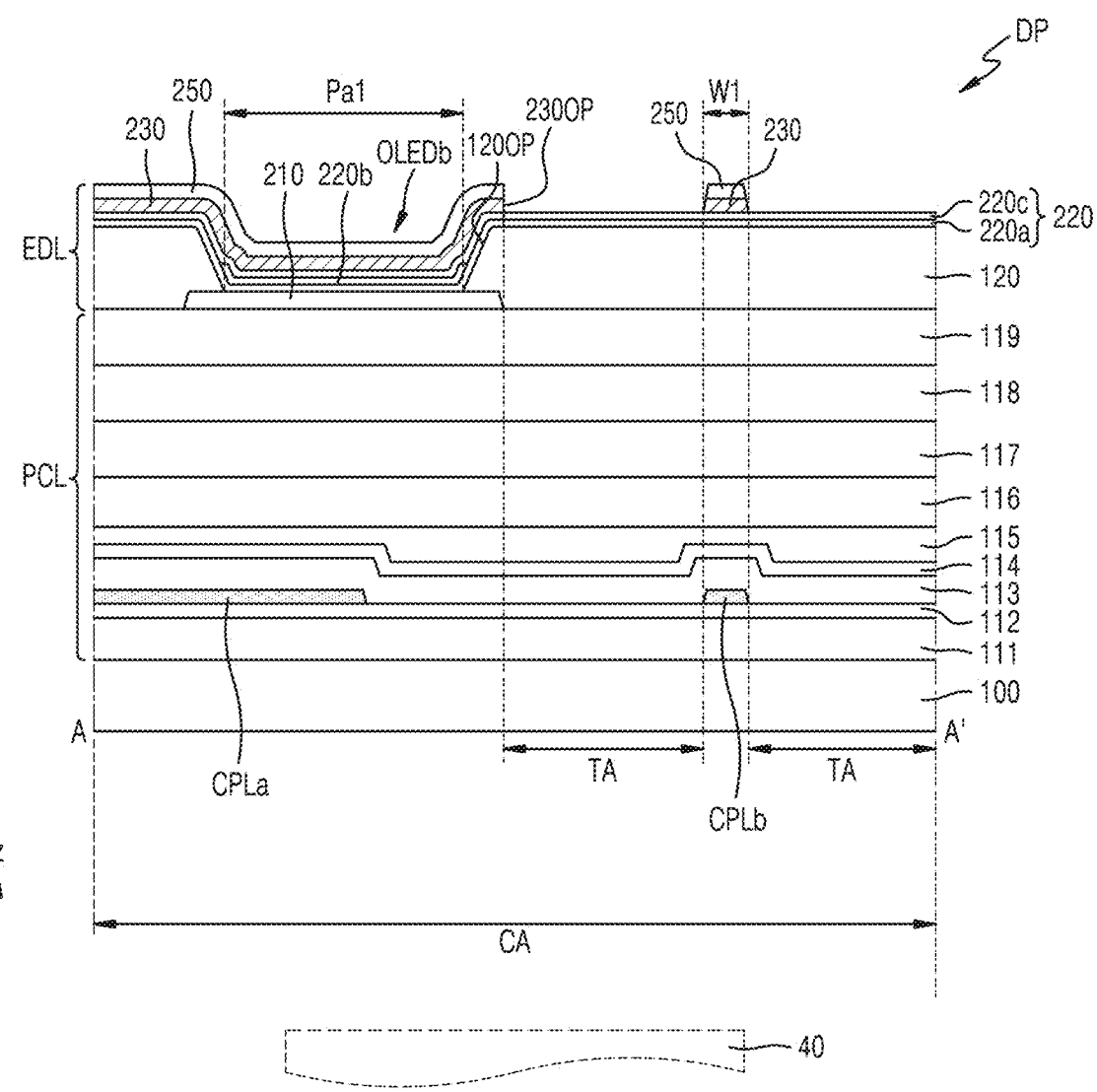
Figure 13:
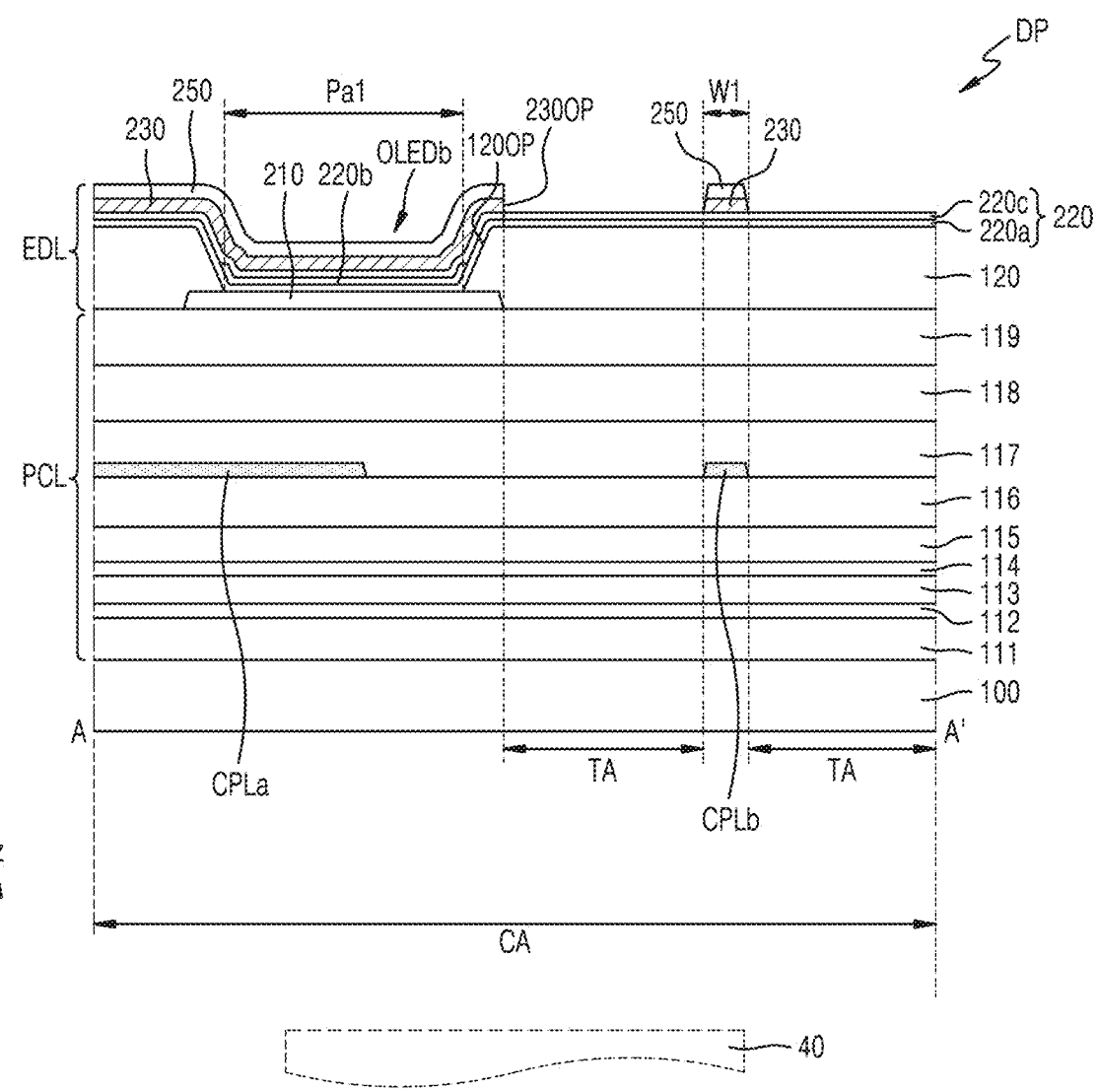
Figure 14:
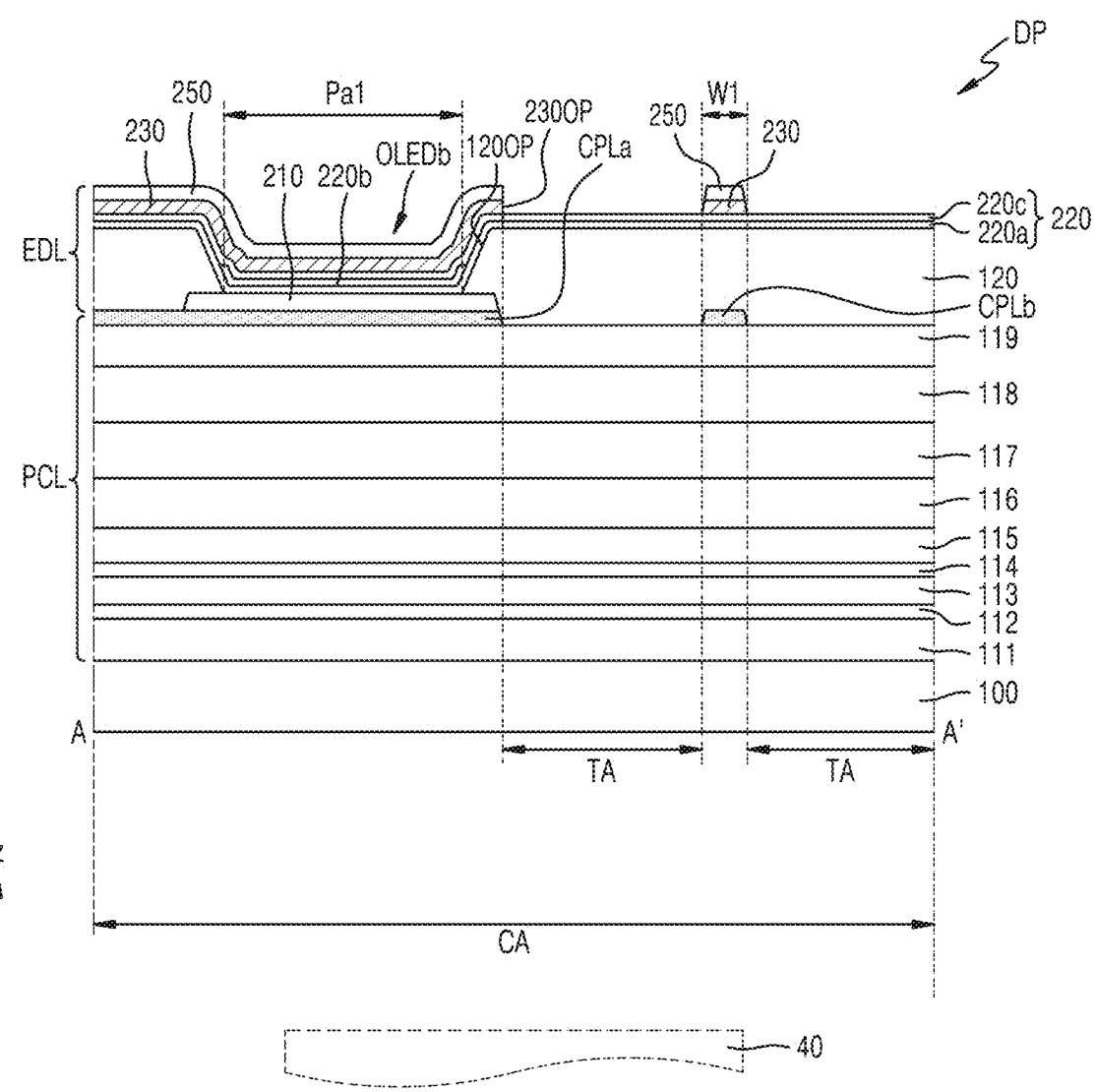

FIG. 9 is a schematic plan view of a shield pattern in a component area and a display element on the shield pattern in a display apparatus according to an embodiment, and FIG. 10 is a schematic plan view of the second electrode on the shield pattern. In addition, FIG. 11 is a cross-sectional view of the component area CA, taken along line A-A' of FIG. 9 or 10. FIGS. 12, 13, and 14 are modified embodiments and schematic cross-sectional views of a portion of the component area CA in the display apparatus according to an embodiment. In FIGS. 9 to 14, the same reference numerals as those of FIG. 8 denote the same members, and thus, repeated descriptions thereof are omitted.

FIG. 9 shows a portion of the component area CA, and a display element corresponding to the first auxiliary sub-pixel may be arranged in the component area CA. With regard to this, FIG. 9 shows a first red organic light-emitting diode OLEDr, a first green organic light-emitting diode OLEDg, and a first blue organic light-emitting diode OLEDb corresponding to first red, green, and blue auxiliary sub-pixels Pb, Pg, and Pr, respectively. The first blue organic light-emitting diode OLEDb may include the first electrode 210, the emission layer 220b, and the second electrode 230 as shown in FIG. 11 which is a cross-sectional view of the component area CA, taken along line A-A' of FIG. 9. Though not shown, the first red organic light-emitting diode OLEDr and the first green organic light-emitting diode OLEDg may include the first electrode 210, the emission layer, and the second electrode 230.

The first red, green, and blue auxiliary sub-pixels Pb, Pg, and Pr may be repeatedly arranged in the component area CA. As an example, the first red, green, and blue auxiliary sub-pixels Pb, Pg, and Pr may be arranged in a pentile structure as shown in FIG. 9. In another embodiment, the first red, green, and blue auxiliary sub-pixels Pb, Pg, and Pr may be arranged in various pixel configuration structure such as a stripe structure, a delta structure or the like.

The first electrode 210 (see FIG. 11) included in each of the first red organic light-emitting diode OLEDr, the first green organic light-emitting diode OLEDg, and the first blue organic light-emitting diode OLEDb may have a curved shape not having an edge or a corner portion where a straight line meets a straight line in a plan view. In another embodiment, the first electrode 210 may include an elliptical shape, a shape having a partial circle, or a shape having a partial ellipse. As described above, because the first electrode 210 has a curved shape, a diffraction of light passing through the component area CA may be reduced.

Referring to FIG. 9, a shield pattern CPL may be arranged between the substrate 100 (see FIG. 11) and the first electrode 210. The shield pattern CPL may overlap the first red organic light-emitting diode OLEDr, the first green organic light-emitting diode OLEDg, and the first blue organic light-emitting diode OLEDb in a plan view. The portions marked by dashed lines in FIG. 9 represent overlapping regions.

The shied pattern CPL may include a first part CPLa and a second part CPLb apart from the first part CPLa. In an embodiment, as shown in FIG. 9, the first part CPLa and the second part CPLb of the shield pattern CPL may each have a wave shape in a lengthwise direction in a plan view. In an embodiment, the shield pattern CPL may have a structure in which the first part CPLa and the second part CPLb are repeated on every odd-numbered row and every even-numbered row, respectively. In a plan view, the first part CPLa of the shield pattern CPL may at least partially overlap each of the first blue organic light-emitting diodes OLEDb and the first red organic light-emitting diodes OLEDr arranged on the same row. In addition, the second part CPLb may at least partially overlap each of the first green organic light-emitting diodes OLEDg arranged on the same row.

However, embodiments according to the invention are not limited thereto, and as described below, in another embodiment, the shield pattern CPL may have a circular curved structure, for example, a spiral shape in a plan view.

The shield pattern CPL is a pattern that blocks light and may include, for example, a material that may absorb or reflect a laser beam. The shield pattern CPL may include a non-transmissive metal and include at least one of molybdenum (Mo), titanium (Ti), aluminum (Al), silver (Ag), and chromium (Cr). In an embodiment, the shield pattern CPL may include a single-layered structure or a multi-layered structure including the above materials, and may have, for example, a structure of Ti/Al/Ti or ITO/Ag/ITO.

The shield pattern CPL may absorb or reflect a laser beam during a laser lift process. Here, the laser lift process may denote a process of irradiating a laser beam in the thickness direction (a z direction) of the substrate 100 (see FIG. 11) from below the substrate 100 (see FIG. 11) and removing a sacrificial layer, which is a target, and a layer thereon. The shield pattern CPL may prevent the layer on the shield pattern CPL from being removed by the laser beam by absorbing or reflecting the laser beam that reaches the shield pattern CPL during the laser lift process. The shield pattern CPL may remain even after the laser left process.

As described above, the first electrodes 210 of the first red organic light-emitting diode OLEDr, the first green organic light-emitting diode OLEDg, and the first blue organic light-emitting diode OLEDb may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. In an embodiment, the first electrode 210 may have a multi-layered structure of ITO/Ag/ITO. In other words, the first electrode 210 may include a non-transmissive electrode such as the shield pattern CPL and absorb or reflect a laser beam. Like the shield pattern CPL, the first electrode 210 may prevent a layer on the first electrode 210 from being removed by a laser beam during the laser lift process.

Referring to FIGS. 9 and 10, the second electrode 230 may have substantially the same shape as the shape in which the first electrodes 210 (see FIG. 11) of the first red organic light-emitting diode OLEDr, the first green organic light-emitting diode OLEDg, and the first blue organic light-emitting diode OLEDb overlap the shield pattern CPL in a plan view. The second electrode 230 may define an opening 2300P arranged between the first part CPLa and the second part CPLb of the shield pattern CPL.

The opening 2300P may be formed by depositing the second electrode 230 on the entire surface of the display area DA and then performing the laser lift process. While the laser lift process is performed, a portion of the second electrode 230 and a layer thereon (e.g., a portion of the upper layer 250 (see FIG. 11)) reached by a laser beam may be removed. However, because the first electrode 210 and the shield pattern CPL may absorb or reflect a laser beam as described above, the second electrode 230 may not be removed in a region that overlaps the first electrodes 210 and the shield pattern CPL. Accordingly, in the case where a laser beam is irradiated to the entire surface, the second electrode 230 may have a shape corresponding to the first electrode 210 and the shield pattern CPL as shown in FIG. 10.

In an embodiment, the opening 2300P of the second electrode 230 may be arranged in only the component area CA. In other words, the second electrode may cover the intermediate area MA (see FIGS. 6A and 6B) and/or the main display area MDA (see FIGS. 6A and 6B) entirely. Though the second electrode 230 defines the opening 2300P locally as shown in FIG. 10, because the second electrode 230 is electrically connected to the common voltage supply line 13 in the non-display area NDA as described with reference to FIG. 3A, the common voltage ELVSS (see FIG. 7) may be applied to the second electrode 230.

The opening 2300P of the second electrode 230 may substantially correspond to the transmission area TA. A transmittance of the transmission area TA of the component area CA may be increased by the opening 2300P of the second electrode 230. Light/signal emitted from the component 40 (see FIG. 5A) arranged below the component area CA, or light/signal incident to the component may be easily transferred.

As described above, when the laser lift process is performed on the entire surface, only portions of the second electrode 230 that correspond to the shield pattern CPL and the first electrode 210 remain and the rest of the second electrode 230 is removed entirely. In other words, the area of the opening 2300P of the second electrode 230 in a plan view may increase, and the transmittance of the component area CA may increase. In addition, because the laser lift process for forming the opening 2300P of the second electrode 230 may not be partially performed but performed entirely, issues such as burr and haze that may occur during a partial process do not occur, and thus, a process management may be easily performed.

Referring to FIG. 11, because there is no sub-pixel circuit in the component area CA, it is easy to form the opening 2300P of the second electrode 230 through the laser lift process, and the area of the opening 2300P may be sufficiently secured. There may be the first part CPLa and the second part CPLb of the shield pattern CPL below the first electrode 210 of the organic light-emitting diode in the component area CA. The second electrode 230 may be arranged in only portions that correspond to the first electrode 210, the first part CPLa, or the second part CPLb of the shield pattern CPL. The rest of portions may define the opening 2300P. In addition, the upper layer 250 on the second electrode 230 may also define the same opening therein as the second electrode 230.

The shield pattern CPL may be arranged between the substrate 100 and the first electrode 210. In an embodiment, the shield pattern CPL may be arranged in the same layer as the gate electrode that overlaps the channel region of the semiconductor layer of the sub-pixel circuit, or an electrode electrically connected to the source region or the drain region of the semiconductor layer, or arranged between the substrate 100 and the semiconductor layer. As an example, the shield pattern CPL may be arranged in the same layer as at least one of the bottom metal layer BML, the upper electrode CE2 of the first gate electrode GE1, the storage capacitor Cst, the first source electrode (not shown) or the first drain electrode DE1, and the contact electrode CM. In addition, in an embodiment, the shield pattern CPL may contact the lower portion of the first electrode 210.

Though it is shown in FIG. 11 that the shield pattern CPL is arranged in the same layer as the bottom metal layer BML arranged between the substrate 100 and the buffer layer 111, it is shown in FIG. 12 that the shield pattern CPL is arranged in the same layer as the first gate electrode GE1 arranged between the first gate insulating layer 112 and the second gate insulating layer 113. In addition, it is shown in FIG. 13 that the shield pattern CPL is arranged in the same layer as the first drain electrode DE1 arranged between the inter-layer-insulating layer 116 and the first organic insulating layer 117. In addition, it is shown in FIG. 14 that the shield pattern CPL is arranged under the first electrode 210 on the third organic insulating layer 119. In an embodiment of FIG. 14, the shield pattern CPL may include a material different from a material of the first electrode 210. However, embodiments according to the invention are not limited thereto. In another embodiment, the shield pattern CPL may include the same material as that of the first electrode 210.

A width W1 (see FIGS. 9 and 10) of the shield pattern CPL in a plan view may change depending on a position at which the shield pattern CPL is arranged. Here, the width W1 of the shield pattern CPL in a plan view may denote a width of each portion of the shield pattern CPL, for example, the second part CPLb in a direction perpendicular to a lengthwise direction of the shield pattern CPL when viewed in a direction (the z direction) perpendicular to the substrate 100. The width W1 of the shield pattern CPL may increase as the shield pattern CPL is away from the second electrode 230 and closer to the laser beam below the substrate 100. As an example, as shown in FIG. 8, in the case where the shield pattern CPL is arranged in the same layer as the bottom metal layer BML, the laser beam is incident diagonally and may be diffracted at a large angle. Accordingly, the width W1 may increase to protect upper layers. On the contrary, as the shield pattern CPL is closer to the second electrode 230, the width W1 of the shield pattern CPL may be formed small. As an example, as shown in FIG. 13, in the case where the shield pattern CPL is arranged in the same layer as the first drain electrode DE1, the width W1 may be smaller than a width in the case where the shield pattern CPL is arranged in the same layer as the bottom metal layer BML.

The width W1 of the shield pattern CPL in a plan view may be about 1 micrometers (μm) to about 9 μm. In an embodiment, the width W1 of the shield pattern CPL in a plan view may be about 1.5 μm to about 8.5 μm. In the case where the width W1 of the shield pattern CPL exceeds 9 μm, because the area of the opening 2300P of the second electrode 230 arranged between the portions of the shield pattern CPL, for example, the first part CPLa and the second part CPLb is reduced, the transmittance may increase. On the contrary, in the case where the width of the shield pattern CPL is less than 1 μm, because a laser beam may be diffracted despite the shield pattern CPL and may reach the layers thereover, the layers over the shield pattern CPL, for example, the second electrode 230 may be removed and disconnected.

Figure 15:
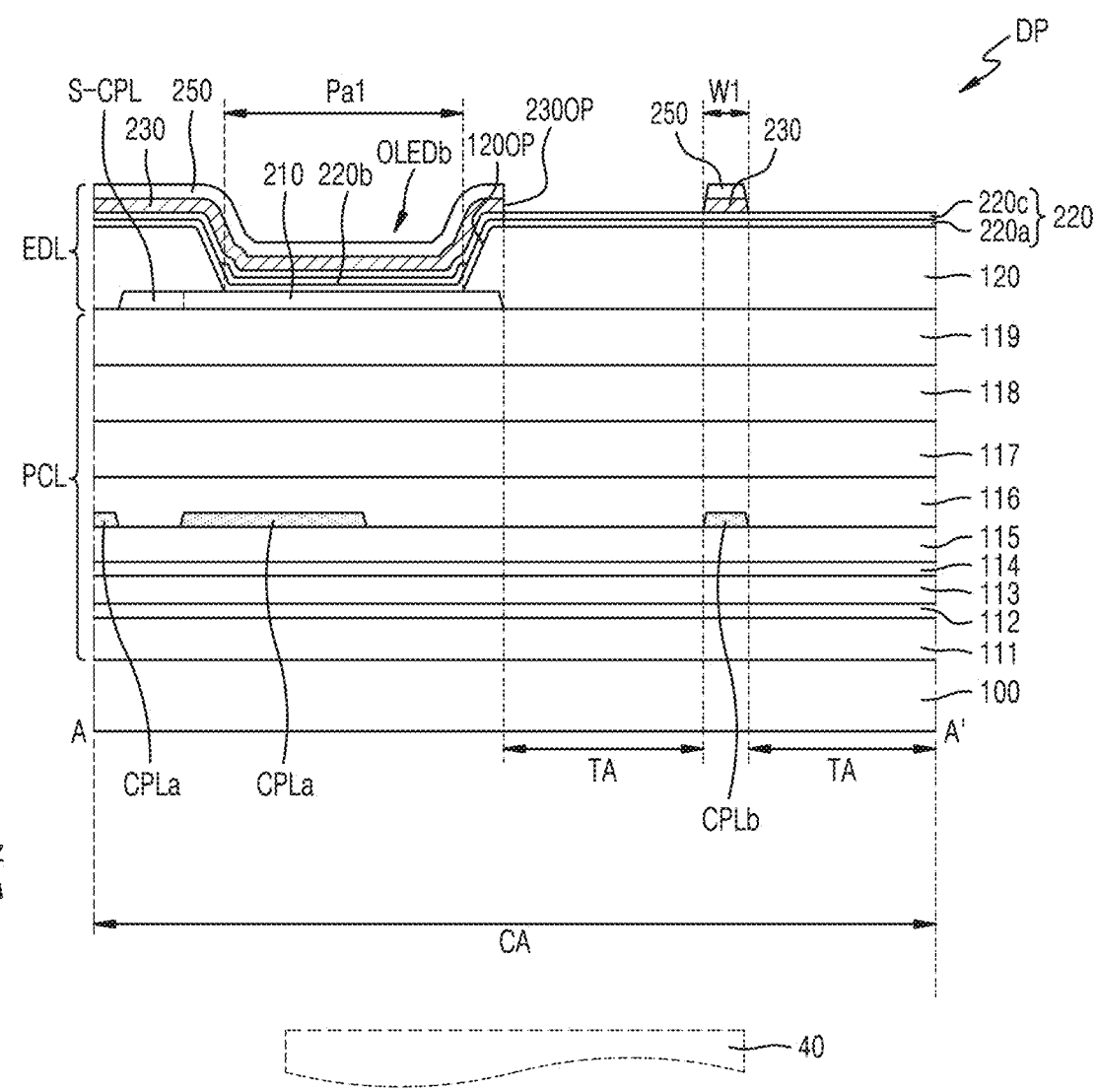

Referring to FIG. 15, the display panel DP may further include a subsidiary shield pattern S-CPL. The subsidiary shield pattern S-CPL may be arranged in the same layer as the first electrode 210. In an embodiment, the subsidiary shield pattern S-CPL may extend from the first electrode 210 as shown in FIG. 15. Because the first electrodes 210 of the first red organic light-emitting diodes OLEDr, the first green organic light-emitting diodes OLEDg, and the first blue organic light-emitting diodes OLEDb should be apart from each other, the subsidiary shield pattern S-CPL extending from the first electrode 210 of one of the organic light-emitting diodes OLED may be apart from the first electrodes 210 of the other organic light-emitting diodes OLED.

The subsidiary shield pattern S-CPL may be arranged together with the shield pattern CPL arranged between the substrate 100 and the first electrode 210. A vertical distance between the subsidiary shield pattern S-CPL and the second electrode 230 is less than a vertical distance between the shield pattern CPL and the second electrode 230, and thus, the occurrence of diffraction during the laser lift process may be reduced by including the subsidiary shield pattern. Accordingly, the area and position of the opening 2300P in a plan view may be relatively precisely controlled during the laser lift process.

Figure 16A:
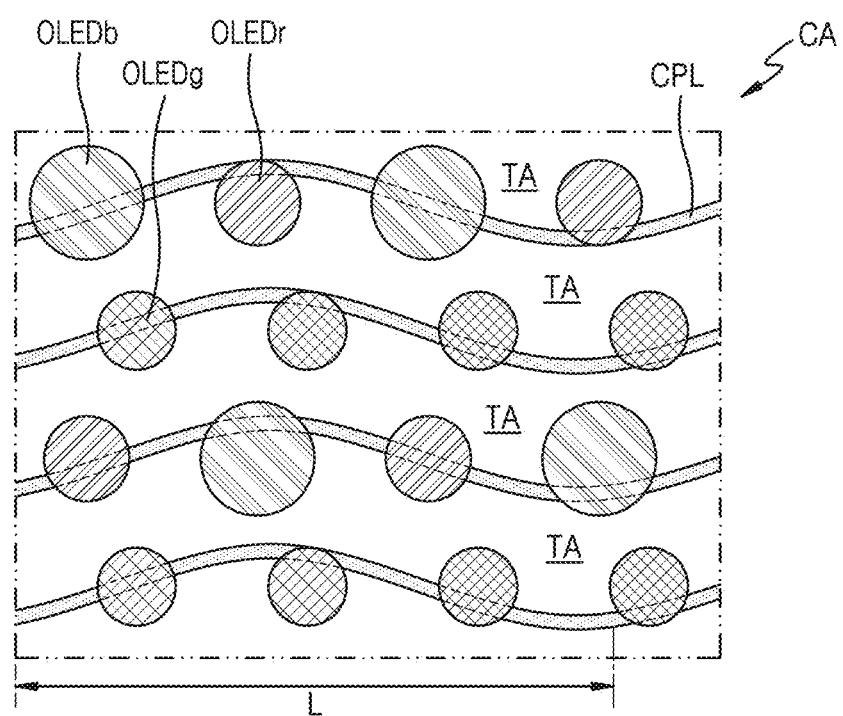
FIGS. 16A and 16B are schematic plan views of a shield pattern and a display element on the shield pattern according to another embodiment.

FIGS. 16A an 16B are modified embodiments of FIG. 9 and schematic plan views of the shield pattern CPL and a display element on the shield pattern CPL according to another embodiment.

Figure 16B:
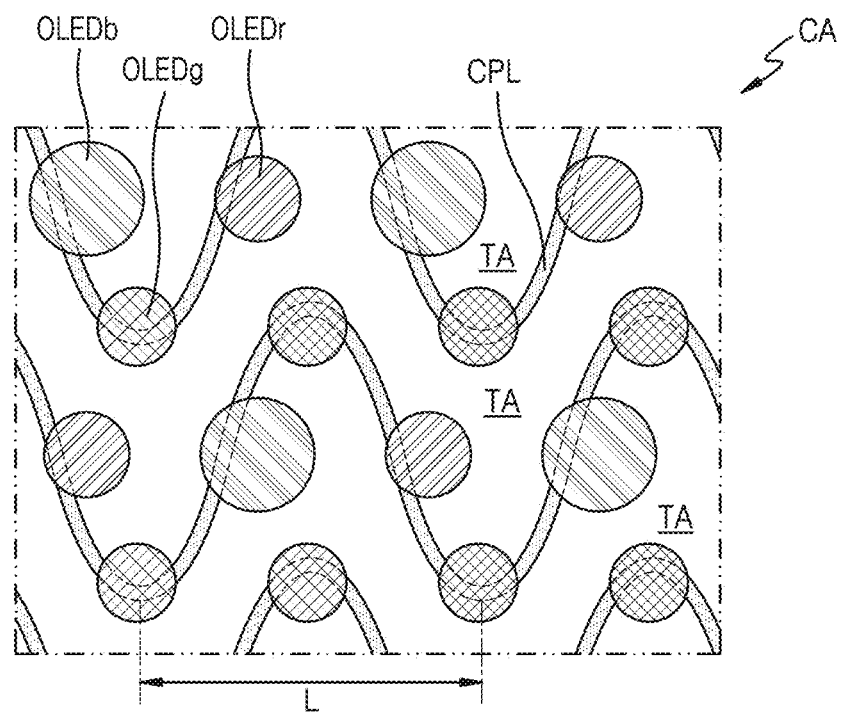

The shield pattern CPL described with reference to FIG. 9 includes a plurality of parts each having a wave shape in a plan view. The configuration of the first red organic light-emitting diodes OLEDr, the first green organic light-emitting diodes OLEDg, and the first blue organic light-emitting diodes OLEDb shown in FIGS. 16A and 16B may be the same as the configuration of the first red organic light-emitting diodes OLEDr, the first green organic light-emitting diodes OLEDg, and the first blue organic light-emitting diodes OLEDb shown in FIG. 9. The period L of the wave shape of the shield pattern CPL of FIG. 16A may be greater than the period of the shield pattern CPL of FIG. 9. In addition, the period L of the wave shape of the shield pattern CPL of FIG. 16B may be less than the period L of the shield pattern CPL of FIG. 9. Because the area of the opening 2300P of the second electrode 230 in FIGS. 16A and 16B is substantially the same as the area of the opening 2300P of the second electrode 230 in FIG. 9, the transmittance may be substantially the same. A diffraction shape of passing light may appear different depending on a change in the shape of the shield pattern CPL, for example, a change in the period L of the wave shape of the shield pattern CPL.

Figure 17A:
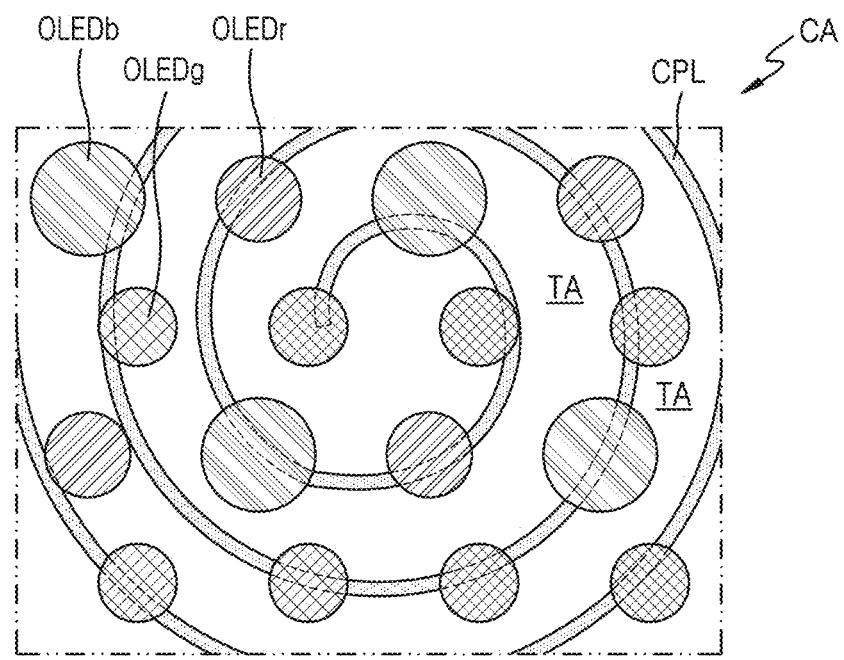
FIGS. 17A and 17B are schematic plan views of a shield pattern and a display element on the shield pattern according to another embodiment.

FIGS. 17A an 17B are modified embodiments of FIG. 9 and schematic plan views of the shield pattern CPL and a display element on the shield pattern CPL according to another embodiment.

In the case where the shield pattern CPL has a regular repeating pattern, diffraction of light occurs, and thus, a portion of passing light may represent specific directionality. Due to this, in the case where the component 40, for example, a camera as an image sensor is arranged in the component area CA, a flare phenomenon may occur. The shield pattern CPL may have a curved structure that may reduce a flare phenomenon.

Figure 17B:
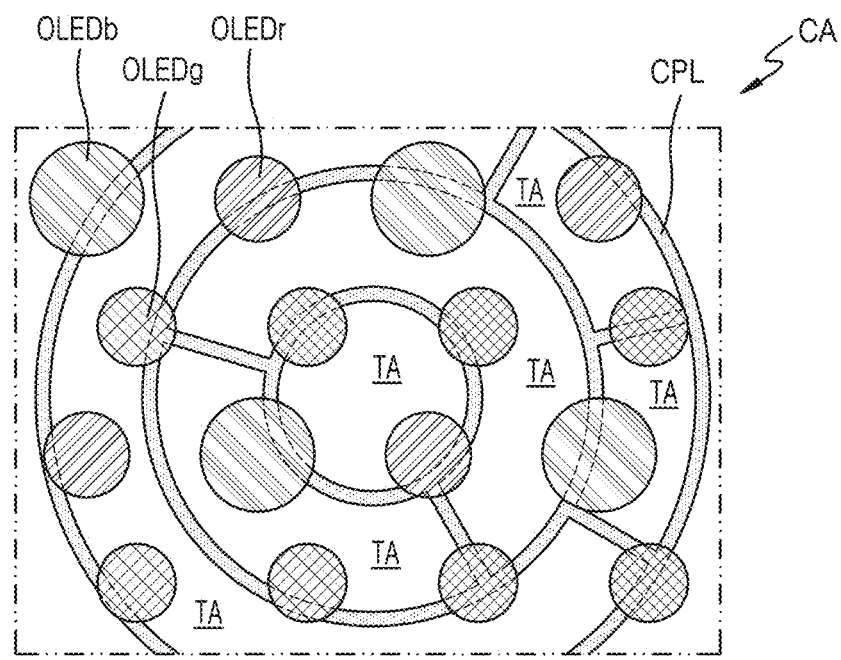

Though it is shown in FIG. 9 that the shield pattern CPL has a wave shape in a plan view as an example of a curved structure, the shield pattern CPL may have a spiral shape in a plan view as shown in FIG. 17A in another embodiment. In addition, in another embodiment, as shown in FIG. 17B, the shield pattern CPL may be at least a portion of a pattern including a plurality of circles having different sizes in a plan view and straight sections arranged to connect the circles. In this case, to reduce the flare phenomenon, the straight sections may be irregularly arranged.

The display apparatus according to an embodiment may reduce the area of the second electrode and improve the transmittance in the component area by including the shield pattern. However, the scope of the present disclosure is not limited by this effect.

As used in connection with various embodiments of the disclosure, the term "module/unit" may include a unit implemented in hardware, software, or firmware, and may be interchangeably used with other terms, for example, "logic," "logic block," "part," or "circuitry". A module may be a single integral component, or a minimum unit or part thereof, adapted to perform one or more functions. For example, according to an embodiment of the disclosure, the module may be implemented in a form of an application-specific integrated circuit (ASIC).

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:
1. A display apparatus including a main display area, a component area, and a non-display area, the display apparatus comprising:
 a substrate;
 a plurality of first display elements arranged in the main display area;
 a plurality of second display elements arranged in the component area, wherein the component area is at least partially surrounded by the main display area; and a shield pattern overlapping the plurality of second display elements in the component area in a plan view,
wherein the shield pattern includes a plurality of parts each having a wave shape in the plan view.

2. The display apparatus of claim 1, wherein the shield pattern is arranged between the substrate and the plurality of second display elements.

3. The display apparatus of claim 1, wherein each of the plurality of first display elements and the plurality of second display elements includes:
a first electrode;
an emission layer overlapping the first electrode; and
a portion of a second electrode that is a common part of the plurality of first display elements and the plurality of second display elements,
wherein the shield pattern overlaps the first electrode of the plurality of second display elements in the plan view.

4. The display apparatus of claim 3, wherein the shield pattern includes a first part and a second part apart from the first part,
wherein the second electrode defines an opening arranged between the first part and the second part of the shield pattern in the plan view.

5. The display apparatus of claim 1, further comprising a plurality of first sub-pixel circuits electrically connected to the plurality of first display elements and arranged in the main display area,
wherein each of the plurality of first sub-pixel circuits includes a semiconductor layer, a gate electrode that overlaps a channel region of the semiconductor layer, and an electrode electrically connected to a source region or a drain region of the semiconductor layer.

6. The display apparatus of claim 5, wherein the shield pattern is arranged in a same layer as the electrode of each of the plurality of first sub-pixel circuits or the gate electrode.

7. The display apparatus of claim 5, wherein the shield pattern is arranged between the substrate and the semiconductor layer.

8. The display apparatus of claim 3, wherein the shield pattern contacts a lower portion of the first electrode.

9. The display apparatus of claim 1, wherein a width of the shield pattern is about 1 μm to about 10 μm.

10. The display apparatus of claim 5, further comprising a plurality of second sub-pixel circuits electrically connected to the plurality of second display elements,
wherein the plurality of second sub-pixel circuits is arranged in the non-display area or between the main display area and the component area.

11. A display apparatus including a main display area, a component area, and a non-display area, the display apparatus comprising:
a substrate;
a plurality of first display elements arranged in the main display area;
a plurality of second display elements arranged in the component area, wherein the component area is at least partially surrounded by the main display area; and
a shield pattern overlapping the plurality of second display elements in the component area in a plan view,
wherein the shield pattern has a spiral shape in the plan view.

12. A display apparatus including a main display area, a component area, and a non-display area, the display apparatus comprising:
a substrate;
a plurality of first display elements arranged in the main display area;
a plurality of second display elements arranged in the component area, wherein the component area is at least partially surrounded by the main display area; and
a shield pattern overlapping the plurality of second display elements in the component area in a plan view,
wherein the shield pattern includes at least a portion of a pattern including a plurality of circles of different sizes and straight sections, and the straight sections are arranged to connect the plurality of circles and disposed between the plurality of circles in the plan view.

* * * * *